US010636354B2

(12) United States Patent
Toyomura

(10) Patent No.: US 10,636,354 B2
(45) Date of Patent: Apr. 28, 2020

(54) DISPLAY ELEMENT, METHOD FOR DRIVING DISPLAY ELEMENT, DISPLAY DEVICE, AND ELECTRONIC DEVICE TO DISPLAY IMAGE WITH REDUCED LUMINANCE UNEVENNESS

(71) Applicant: SONY CORPORATION, Tokyo (JP)

(72) Inventor: Naobumi Toyomura, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/760,572

(22) PCT Filed: Jul. 15, 2016

(86) PCT No.: PCT/JP2016/071002
§ 371 (c)(1),
(2) Date: Mar. 15, 2018

(87) PCT Pub. No.: WO2017/056646
PCT Pub. Date: Apr. 6, 2017

(65) Prior Publication Data
US 2018/0247590 A1 Aug. 30, 2018

(30) Foreign Application Priority Data
Sep. 30, 2015 (JP) .................................. 2015-193472

(51) Int. Cl.
*G09G 3/3233* (2016.01)
*G09G 3/3275* (2016.01)
(Continued)

(52) U.S. Cl.
CPC ......... *G09G 3/3233* (2013.01); *G09G 3/3258* (2013.01); *G09G 3/3275* (2013.01);
(Continued)

(58) Field of Classification Search
CPC ... G09G 2300/0819; G09G 2300/0842; G09G 2310/0259
See application file for complete search history.

(56) References Cited

U.S. PATENT DOCUMENTS

2002/0196213 A1 12/2002 Akimoto et al.
2009/0115765 A1* 5/2009 Toyomura ............ G09G 3/3233
345/211
(Continued)

FOREIGN PATENT DOCUMENTS

CN          1393838 A     1/2003
CN        102163398 A     8/2011
(Continued)

OTHER PUBLICATIONS

International Search Report and Written Opinion of PCT Application No. PCT/JP2016/071002, dated Oct. 4, 2016, 09 pages.

*Primary Examiner* — Chun-Nan Lin
(74) *Attorney, Agent, or Firm* — Chip Law Group

(57) ABSTRACT

A display element includes a light-emitting unit and a drive circuit that drives the light-emitting unit, in which the drive circuit includes at least a drive transistor and a capacitor, and the drive transistor is configured such that a voltage is supplied to one source/drain region, and another source/drain region is connected to the light-emitting unit, and a current corresponding to a voltage held by the capacitor flows through the light-emitting unit via the drive transistor; and a voltage of a ramp waveform is applied to the other source/drain region in a state where a voltage of the capacitor is set such that the drive transistor is in a non-conductive state and a gate electrode is electrically floating, and afterwards, a predetermined constant voltage is applied to the gate electrode in a state where application of the voltage of the ramp waveform is continued, and accordingly a voltage (Continued)

corresponding to a degree of slope of the ramp waveform is held by the capacitor.

12 Claims, 12 Drawing Sheets

(51) Int. Cl.
    *G09G 3/3258*     (2016.01)
    *H01L 27/32*     (2006.01)
    *H01L 51/50*     (2006.01)
    *H01L 51/52*     (2006.01)

(52) U.S. Cl.
    CPC ...... *H01L 27/3297* (2013.01); *H01L 51/5036* (2013.01); *H01L 51/5056* (2013.01); *H01L 51/5072* (2013.01); *H01L 51/5206* (2013.01); *H01L 51/5221* (2013.01); *G09G 2300/0819* (2013.01); *G09G 2300/0842* (2013.01); *G09G 2310/0259* (2013.01); *G09G 2310/066* (2013.01)

(56) References Cited

U.S. PATENT DOCUMENTS

| | | | |
|---|---|---|---|
| 2011/0205220 A1* | 8/2011 | Ota | G09G 3/3233 345/212 |
| 2014/0132646 A1* | 5/2014 | Aoki | G09G 3/3233 345/691 |

FOREIGN PATENT DOCUMENTS

| | | |
|---|---|---|
| JP | 2003-005709 A | 1/2003 |
| JP | 2003-223136 A | 8/2003 |
| JP | 2009-008799 A | 1/2009 |
| JP | 2011-170181 A | 9/2011 |
| JP | 2012-247471 A | 12/2012 |
| JP | 2013-044847 A | 3/2013 |
| KR | 10-2002-0096851 A | 12/2002 |

\* cited by examiner

[ $H_{m-p}$ ]

[ $H_{m-p}$ ] (CONTINUATION)

DISPLAY ELEMENT, METHOD FOR DRIVING DISPLAY ELEMENT, DISPLAY DEVICE, AND ELECTRONIC DEVICE TO DISPLAY IMAGE WITH REDUCED LUMINANCE UNEVENNESS

CROSS REFERENCE TO RELATED APPLICATIONS

This application is a U.S. National Phase of International Patent Application No. PCT/JP2016/071002 filed on Jul. 15, 2016, which claims priority benefit of Japanese Patent Application No. JP 2015-193472 filed in the Japan Patent Office on Sep. 30, 2015. Each of the above-referenced applications is hereby incorporated herein by reference in its entirety.

TECHNICAL FIELD

The present disclosure relates to a display element, a method for driving a display element, a display device, and an electronic device.

BACKGROUND ART

A display element including a current drive type light-emitting unit, and a display device including the display element are known. For example, a display element including a light-emitting unit utilizing electroluminescence of an organic material (hereinafter may be simply referred to as an organic EL display element) is noted as a display element capable of high luminance light emission by low voltage direct current drive.

Similarly to a liquid crystal display device, for example, in a display device including the organic EL display element, a simple matrix system and an active matrix system are known as a drive system. The active matrix system has a disadvantage that its structure is complicated, but has an advantage that a luminance of an image can be increased, for example. The organic EL display element driven by the active matrix system includes a light-emitting unit including an organic layer including a light emitting layer and the like, and also includes a drive circuit for driving the light-emitting unit.

For example, Japanese Patent Application Laid-Open No. 2003-223136 (Patent Document 1) and the like describe the use of ramp waveform sloping wave voltage for driving such a display element.

CITATION LIST

Patent Document

Patent Document 1: Japanese Patent Application Laid-Open No. 2003-223136

SUMMARY OF THE INVENTION

Problems to be Solved by the Invention

In Patent Document 1 and the like, the ramp waveform is exclusively used for comparison with a video signal voltage previously written in the display element. That is, luminance information of the image to be displayed is applied to the display element as the video signal voltage. Therefore, it is necessary to apply the ramp waveform and the video signal to the display element.

An object of the present disclosure is to provide: a display element to which the luminance information of the image to be displayed can be supplied in accordance with only the ramp waveform, more specifically, a degree of slope of the ramp waveform; a method for driving the display element; a display device including the display element; and an electronic device including the display device.

Solutions to Problems

A display element according to the present disclosure to achieve the object described above, includes:
a light-emitting unit and a drive circuit that drives the light-emitting unit, in which
the drive circuit includes at least a drive transistor and a capacitor, and the drive transistor is configured such that a voltage is supplied to one source/drain region, and another source/drain region is connected to the light-emitting unit, and a current corresponding to a voltage held by the capacitor flows through the light-emitting unit via the drive transistor, and
a voltage of a ramp waveform is applied to the other source/drain region in a state where a voltage of the capacitor is set such that the drive transistor is in a non-conductive state and a gate electrode is electrically floating, and afterwards, a predetermined constant voltage is applied to the gate electrode in a state where application of the voltage of the ramp waveform is continued, and accordingly a voltage corresponding to a degree of slope of the ramp waveform is held by the capacitor.

A method for driving a display element according to the present disclosure to achieve the object described above, including
using a display element including a light-emitting unit and a drive circuit that drives the light-emitting unit, in which the drive circuit includes at least a drive transistor and a capacitor, and the drive transistor is configured such that a voltage is supplied to one source/drain region, and another source/drain region is connected to the light-emitting unit, and a current corresponding to a voltage held by the capacitor flows through the light-emitting unit via the drive transistor, and
setting the voltage of the capacitor such that the drive transistor is in a non-conductive state and bringing a gate electrode into an electrically floating state, and applying a voltage of a ramp waveform to the other source/drain region, and then applying a predetermined constant voltage to the gate electrode in a state where application of the voltage of the ramp waveform is continued, to cause the capacitor to hold a voltage corresponding to the degree of slope of the ramp waveform.

A display device according to the present disclosure to achieve the object described above, includes:
a display unit on which a display element is arranged; and a drive unit that drives the display unit, in which
the display element includes a light-emitting unit and a drive circuit that drives the light-emitting unit, the drive circuit includes at least a drive transistor and a capacitor, and the drive transistor is configured such that a voltage is supplied to one source/drain region, and another source/drain region is connected to the light-emitting unit, and a current corresponding to a voltage held by the capacitor flows through the light-emitting unit via the drive transistor, and
the drive unit sets the voltage of the capacitor such that the drive transistor is in a non-conductive state and brings a gate electrode into an electrically floating state, and applies a voltage of a ramp waveform to the other source/drain region, and then applies a predetermined constant voltage to the gate electrode in a state where application of the voltage of the ramp waveform is continued, to cause the capacitor to hold a voltage corresponding to the degree of slope of the ramp waveform.

An electronic device according to the present disclosure to achieve the object described above, includes:

a display device, the display device including a display unit on which a display element is arranged; and a drive unit that drives the display unit, in which the display element includes a light-emitting unit and a drive circuit that drives the light-emitting unit, the drive circuit includes at least a drive transistor and a capacitor, and the drive transistor is configured such that a voltage is supplied to one source/drain region, and another source/drain region is connected to the light-emitting unit, and a current corresponding to a voltage held by the capacitor flows through the light-emitting unit via the drive transistor, and the drive unit sets the voltage of the capacitor such that the drive transistor is in a non-conductive state and brings a gate electrode into an electrically floating state, and applies a voltage of a ramp waveform to the other source/drain region, and then applies a predetermined constant voltage to the gate electrode in a state where application of the voltage of the ramp waveform is continued, to cause the capacitor to hold a voltage corresponding to the degree of slope of the ramp waveform.

Effects of the Invention

With the display element according to the present disclosure, the voltage of the ramp waveform is applied to the other source/drain region in the state where the voltage of the capacitor is set such that the drive transistor is in the non-conductive state and the gate electrode is electrically floating, and afterwards, the predetermined constant voltage is applied to the gate electrode in the state where application of the voltage of the ramp waveform is continued, and accordingly the voltage corresponding to the degree of slope of the ramp waveform is held by the capacitor. Therefore, it is possible to supply the luminance information of the image to be displayed, by the degree of slope of the ramp waveform. In addition, since the voltage held by the capacitor is also affected by the characteristics of the drive transistor, as a result, luminance variation due to variation in the characteristics of the drive transistor is also reduced. In the display device and the electronic device of the present disclosure, an image can be displayed with reduced luminance unevenness. Note that, the effect described here is not necessarily limited, and any effect described in the present disclosure may be obtained.

BRIEF DESCRIPTION OF DRAWINGS

FIG. 10 is an external view of a lens interchangeable single lens reflex type digital still camera.

MODE FOR CARRYING OUT THE INVENTION

Figure 1:
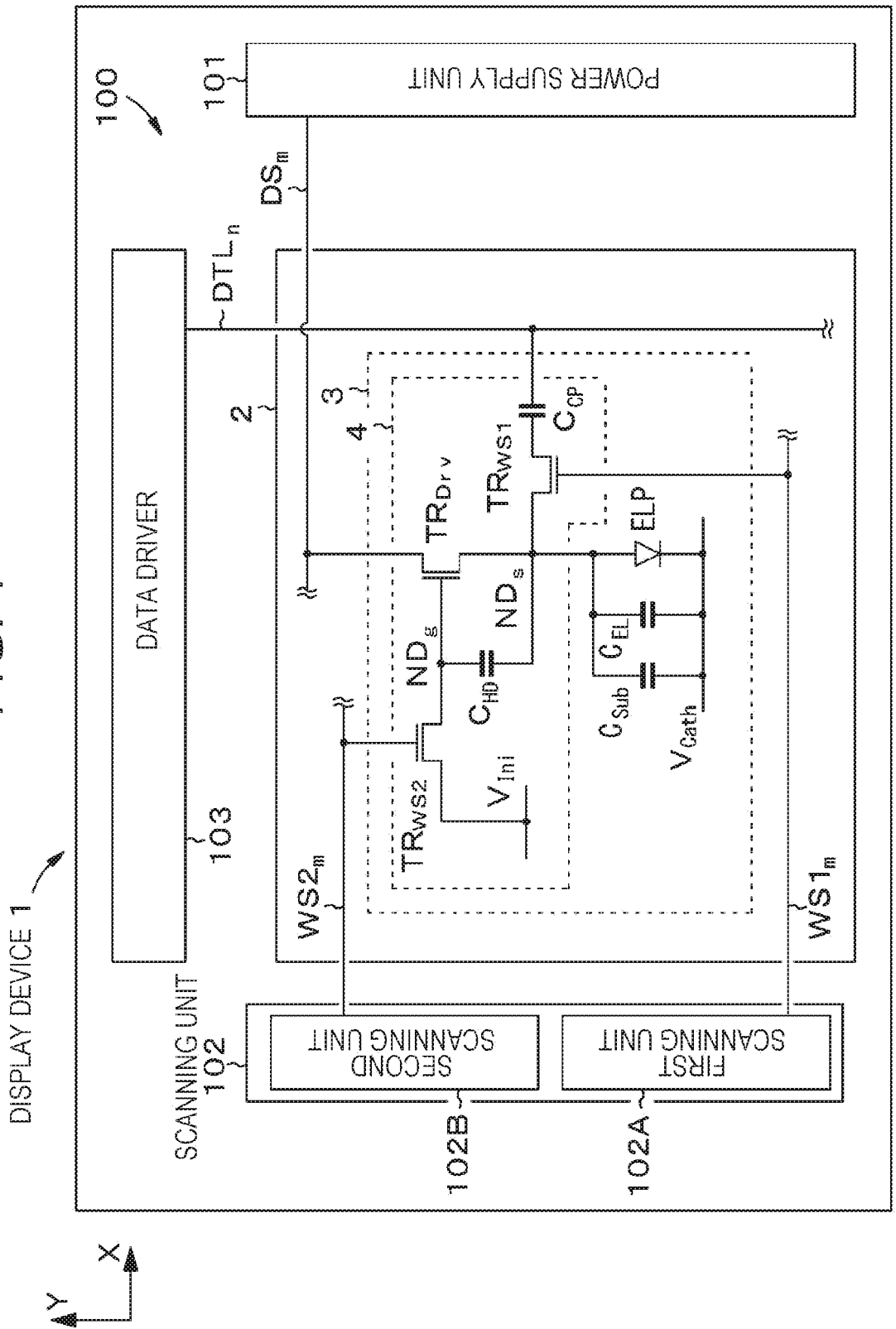
FIG. 1 is a conceptual diagram of a display device according to a first embodiment.

Hereinafter, the present disclosure will be described on the basis of embodiments with reference to the drawings. The present disclosure is not limited to the embodiments, and various numerical values and materials in the embodiments are examples. In the following description, the same reference signs will be used for the same elements or elements having the same function, and redundant description will be omitted. Note that, description will be made in the following order.

1. General Description Related to Display Element, Method for Driving Display Element, Display Device, and Electronic Device According to Present Disclosure 2. First Embodiment and Others General Description related to Display Element, Method for Driving Display Element, Display Device, and Electronic Device according to Present Disclosure A display element, a method for driving a display element, a display device, and an electronic device according to the present disclosure (hereinafter may be simply referred to as "the present disclosure") can each have a configuration in which the display element is scanned at a constant cycle, and a period during which the voltage of the ramp waveform is applied to the other source/drain region of the drive transistor is set to a constant length within the cycle. In this case, the present disclosure can have a configuration in which a period during which the predetermined constant voltage is applied to the gate electrode in a state where application of the voltage of the ramp waveform is continued is set to a constant length within the cycle.

The present disclosure including the preferable configuration described above can have a configuration in which the drive transistor includes a field effect transistor. A configuration of the field effect transistor is not particularly limited as far as no trouble occurs in operation. For example, the present disclosure can have a configuration in which the drive transistor includes an n-channel field effect transistor, and the capacitor is connected between the gate electrode of the drive transistor and the other source/drain region.

The present disclosure including various preferable configurations described above can have a configuration in which the drive circuit further includes a first switching element, in the first switching element, the voltage of the ramp waveform is applied to one end, and another end is connected to the other source/drain region of the drive transistor, and the first switching element is set in a conductive state, and accordingly the voltage of the ramp waveform is applied to the other source/drain region of the drive transistor.

In this case, the present disclosure can have a configuration in which the voltage of the ramp waveform is applied to the one end of the first switching element via coupling capacitance. Alternatively, the present disclosure can have a configuration in which the other end of the first switching element is connected to the other source/drain region of the drive transistor via coupling capacitance.

The present disclosure including various preferable configurations described above can have a configuration in which the drive circuit further includes a second switching element, in the second switching element, a predetermined constant voltage is applied to one end, and another end is connected to the gate electrode of the drive transistor, and the second switching element is set in a conductive state, and accordingly the predetermined constant voltage is applied to the gate electrode of the drive transistor.

A known switching element can be used as the first switching element and second switching element described above. Note that, from a viewpoint of commonality of the manufacturing process and the like, it is preferable to configure the switching elements from the field effect transistors.

The present disclosure including various preferable configurations described above can have a configuration in which after an initialization voltage is applied to the one source/drain region of the drive transistor and a potential of the other source/drain region is initialized, the predetermined constant voltage is applied to the gate electrode of the drive transistor and then application of the voltage is shut off, and accordingly the state is set where the voltage of the capacitor is set such that the drive transistor is in the non-conductive state and the gate electrode is electrically floating.

The present disclosure including various preferable configurations described above can have a configuration in which after the voltage corresponding to the degree of slope of the ramp waveform is held by the capacitor, application of the predetermined constant voltage to the gate electrode of the drive transistor is shut off, and accordingly the light-emitting unit is caused to emit light by the current flowing via the drive transistor.

The present disclosure including various preferable configurations described above can have a configuration in which the light-emitting unit includes a current drive type electro-optical element whose light emission luminance varies in accordance with a value of a current flowing. Examples of the current drive type light-emitting unit include an organic electroluminescence light-emitting unit, an LED light-emitting unit, a semiconductor laser light-emitting unit, and the like. These light-emitting units can be configured using known materials and methods. From a viewpoint of configuring a flat type display device, the light-emitting unit preferably includes the organic electroluminescence light-emitting unit among the current drive type light-emitting units.

The drive unit used in the present disclosure including various preferable configurations described above includes circuits such as a scanning unit, a data driver, and a power supply unit. These circuits can be configured using known circuit elements and the like.

The display device may have a so-called monochrome display configuration or a color display configuration. The color display configuration can have a configuration in which one pixel includes a plurality of sub-pixels, more specifically, one pixel includes three sub-pixels, a red light emitting sub-pixel, a green light emitting sub-pixel, and a blue light emitting sub-pixel. Further, the color display configuration can be configured from one set to which one or more kinds of sub-pixels are further added to these three kinds of sub-pixels (for example, one set to which a sub-pixel emitting white light is added for improving luminance, one set to which sub-pixels respectively emitting complementary colors are added for expanding a color reproduction range, one set to which a sub-pixel emitting yellow is added for expanding the color reproduction range, and one set to which sub-pixels respectively emitting yellow and cyan are added for expanding the color reproduction ranges).

As pixel values of the display device, some of the image display resolutions can be exemplified, such as VGA (640, 480), S-VGA (800, 600), XGA (1024, 768), APRC (1152, 900), S-XGA (1280, 1024), U-XGA (1600, 1200), HD-TV (1920, 1080), and Q-XGA (2048, 1536), and in addition, (1920, 1035), (720, 480), and (1280, 960); however, the pixel values are not limited to these values.

The display element configuring the display unit is formed in a certain plane (for example, formed on a support), and the light-emitting unit is formed above a drive circuit that drives the light-emitting unit, via an interlayer insulating layer, for example.

Examples of the transistor configuring the drive circuit include a thin film transistor (TFT). The transistor may be of an enhancement type or a depletion type. In an n-channel transistor, a lightly doped drain structure (LDD structure) may be formed. In some cases, the LDD structure may be formed asymmetrically. For example, since a large current flows through the drive transistor during light emission of the display element, it is also possible to adopt a configuration in which the LDD structure is formed only in the one source/drain region to be the drain region during the light emission. A configuration of the drive circuit is not particularly limited as far as the drive circuit is suitable for operation of the present disclosure.

In two source/drain regions included in one transistor, the term "one source/drain region" may be used in the meaning of a source/drain region connected to a power supply side. In addition, "a transistor is in a conductive state" means a state in which a channel is formed between the source/drain regions. It does not matter whether or not a current flows from the one source/drain region to the other source/drain region of the transistor. On the other hand, "a transistor is in a non-conductive state" means a state in which no channel is formed between the source/drain regions. In addition, the source/drain regions not only can be configured from a conductive material such as polysilicon or amorphous silicon containing impurities, but also can be configured from a metal, an alloy, conductive particles, a laminated structure thereof, or a layer including an organic material (conductive polymer).

The capacitor configuring the drive circuit can be configured from one electrode, the other electrode, and a dielectric layer sandwiched between these electrodes. This also applies to coupling capacitance and auxiliary capacitance as described later. The transistor and the like configuring the drive circuit are formed in a certain plane (for example, formed on the support), and the light-emitting unit is formed above the transistor and the capacitor configuring the drive circuit, via an interlayer insulating layer, for example. In addition, the other source/drain region of the drive transistor is connected to one end of the light-emitting unit (an anode electrode and the like included in the light-emitting unit) via a contact hole, for example. Note that, a configuration may be adopted in which a transistor is formed on a semiconductor substrate or the like.

Various wiring lines such as scanning lines, data lines, and feeder lines are formed on a certain plane (for example, on the support). These wiring lines can have known configurations and structures.

As a constituent material of the support or a substrate as described later, glass materials can be exemplified, such as high-strain point glass, soda glass ($Na_2O \cdot CaO \cdot SiO_2$), borosilicate glass ($Na_2O \cdot B_2O_3 \cdot SiO_2$), forsterite ($2MgO \cdot SiO_2$), and lead glass ($Na_2O \cdot PbO \cdot SiO_2$), and in addition, polymeric materials having flexibility can be exemplified, such as polyether sulfone (PES), polyimide, polycarbonate (PC), and polyethylene terephthalate (PET). Note that, various coatings may be applied to surfaces of the support and the substrate. The constituent materials of the support and the substrate may be the same as each other or different from each other. If the support and substrate including the polymeric material having flexibility are used, a display device having flexibility can be configured.

Conditions shown in various expressions in the present specification are satisfied not only in a case where each of the expressions mathematically strictly holds but also in a case where each of the expressions substantially holds. With respect to holding of the expressions, existence is permitted of various variations caused by designing or manufacturing the display element and the display device.

In the timing chart used in the following description, the length (time length) of the horizontal axis indicating each period is a schematic one and does not indicate the ratio of the time length of each period. This also applies to the vertical axis. The shape of the waveform in the timing chart is also schematic.

First Embodiment

A first embodiment relates to a display element, a display device, and a method for driving the element and device according to the present disclosure.

FIG. 1 is a conceptual diagram of the display device according to the first embodiment.

A display device 1 includes: a display unit 2 on which a display element 3 is arranged including a light-emitting unit ELP and a drive circuit 4 that drives the light-emitting unit ELP; and a drive unit 100 that drives the display unit 2.

In the display unit 2, the display element 3 is arranged in a two-dimensional matrix in a state of being connected to a first scanning line WS1, a second scanning line WS2, a feeder line DS, and a data line DTL. The first scanning line WS1, the second scanning line WS2, and the feeder line DS are provided to extend in a row direction (X direction in FIG. 1), and the data line DTL is provided to extend in a column direction (Y direction in FIG. 1).

Note that, for convenience of illustration, FIG. 1 illustrates a connection relationship for one display element 3, more specifically, an (n, m)-th display element 3 as described later.

The drive unit 100 includes a power supply unit 101, a scanning unit 102, and a data driver 103. The scanning unit 102 includes a first scanning unit 102A and a second scanning unit 102B.

A drive voltage and the like are supplied from the power supply unit 101 to the feeder line DS. A signal is supplied to the first scanning line WS1 from the first scanning unit 102A, and a signal is supplied from the second scanning unit 102B to the second scanning line WS2. A voltage of a ramp waveform is supplied from the data driver 103 to the data line DTL.

Although not illustrated in FIG. 1, an area (display area) in which the display unit 2 displays an image includes the display elements 3 arranged in a two-dimensional matrix of N elements in the row direction and M elements in the column direction, total N×M elements. The number of rows of the display elements 3 in the display area is M, and the number of the display elements 3 configuring rows is N.

The number of the first scanning lines WS1, the number of the second scanning lines WS2, and the number of the feeder lines DS are each M. The display elements 3 in an m-th row (where m=1, 2, ..., M) are connected to an m-th first scanning line $WS1_m$, an m-th second scanning line $WS2_m$, and an m-th feeder line $DS_m$, and configure one display element row. Note that, in FIG. 1, only the first scanning line $WS1_m$, the second scanning line $WS2_m$, and the feeder line $DS_m$ are illustrated.

In addition, the number of the data lines DTL is N. The display elements 3 in an n-th column (where n=1, 2, ..., N) are connected to an n-th data line $DTL_n$. Note that, in FIG. 1, only the data line $DTL_n$ is illustrated.

The drive circuit 4 included in the display element 3 includes at least a drive transistor $TR_{Drv}$ and a capacitor $C_{HD}$. In the drive transistor $TR_{Drv}$, a voltage is supplied to one source/drain region, the other source/drain region is connected to the light-emitting unit ELP, and a current corresponding to a voltage held by the capacitor $C_{HD}$ flows through the light-emitting unit ELP via the drive transistor $TR_{Drv}$. The light-emitting unit ELP is a current drive type electro-optical element whose light emission luminance varies in accordance with a value of a current flowing, and more specifically, includes an organic electroluminescence light-emitting unit.

As will be described in detail later with reference to FIG. 3 and the like, the drive unit 100 sets the voltage of the capacitor $C_{HD}$ such that the drive transistor $TR_{Drv}$ is in a non-conductive state and sets a gate electrode in an electrically floating state, and applies the voltage of the ramp waveform to the other source/drain region, and then applies a predetermined constant voltage to the gate electrode in a state where application of the voltage of the ramp waveform is continued, to cause the capacitor $C_{HD}$ to hold a voltage according to a degree of slope of the ramp waveform.

In the first embodiment, the drive transistor $TR_{Drv}$ includes an n-channel field effect transistor. In the drive transistor $TR_{Drv}$, the one source/drain region is connected to the feeder line DS, and the other source/drain region is connected to one end of the light-emitting unit ELP, more specifically, an anode electrode included in the light-emitting unit ELP. The capacitor $C_{HD}$ is connected between the gate electrode of the drive transistor $TR_{Drv}$, and the other source/drain region.

The capacitor $C_{HD}$ is used to hold a voltage of the gate electrode (so-called gate-source voltage) with respect to a source region of the drive transistor $TR_{Drv}$. The "source region" in this case means a source/drain region on a side serving as a "source region" when the light-emitting unit ELP emits light. In a light emitting state of the display element 3, the one source/drain region (the side connected to the feeder line DS in FIG. 1) of the drive transistor $TR_{Drv}$ serves as a drain region, and the other source/drain region (one end of the light-emitting unit ELP, specifically, the side connected to the anode electrode) serves as a source region.

The drive circuit 4 further includes a first switching element $TR_{WS1}$. Similarly to the drive transistor $TR_{Drv}$, the first switching element $TR_{WS1}$ includes an n-channel field effect transistor. A gate electrode of the first switching element $TR_{WS1}$ is connected to the first scanning line WS1, and conduction/non-conduction of the first switching element $TR_{WS1}$ is controlled by the signal from the first scanning unit 102A.

In the first switching element $TR_{WS1}$, the voltage of the ramp waveform is applied to one end (one source/drain region), and the other end (the other source/drain region) is connected to the other source/drain of the drive transistor $TR_{Drv}$. Then, the first switching element $TR_{WS1}$ is set in a conductive state, whereby the voltage of the ramp waveform is applied to the other source/drain region of the drive transistor $TR_{Drv}$.

In the example illustrated in FIG. 1, the one end of the first switching element $TR_{WS1}$ is connected to the data line DTL via coupling capacitance $C_{CP}$. Therefore, the voltage of the ramp waveform is applied to the one end of the first switching element $TR_{WS1}$ via the coupling capacitance $C_{CP}$. Note that, a configuration may be adopted in which a position of the coupling capacitance $C_{CP}$ is switched, that is, the other end of the first switching element $TR_{WS1}$ is connected to the other source/drain region of the drive transistor $TR_{Drv}$ via the coupling capacitance $C_{CP}$.

The drive circuit 4 further includes a second switching element $TR_{WS2}$. Similarly to the drive transistor $TR_{Drv}$, the second switching element $TR_{WS2}$ also includes an n-channel field effect transistor. A gate electrode of the second switching element $TR_{WS2}$ is connected to the second scanning line WS2, and conduction/non-conduction of the second switching element $TR_{WS2}$ is controlled by the signal from the second scanning unit 102B.

In the second switching element $TR_{WS2}$, a predetermined constant voltage $V_{Ini}$ is applied to one end (one source/drain region), and the other end (the other source/drain region) is connected to the gate electrode of the drive transistor $TR_{Drv}$. Then, the second switching element $TR_{WS2}$ is set in a conductive state, whereby the predetermined constant voltage $V_{Ini}$ is applied to the gate electrode of the drive transistor $TR_{Drv}$.

Note that, the first switching element $TR_{WS1}$ and the second switching element $TR_{WS2}$ can each also include a p-channel field effect transistor. In addition, the display element 3 may further include another transistor.

A reference sign $ND_g$ indicates a node including elements connected to the gate electrode of the drive transistor $TR_{Drv}$. The node $ND_g$ includes the other end of the second switching element $TR_{WS2}$, one electrode of the capacitor $C_{HD}$, and the gate electrode of the drive transistor $TR_{Drv}$, connected together.

A reference sign $ND_s$ indicates a node including elements connected to the other source/drain region of the drive transistor $TR_{Drv}$. The node $ND_s$ includes the anode electrode of the light-emitting unit ELP, the other end of the first switching element $TR_{WS1}$, and the other source/drain region of the drive transistor $TR_{Drv}$, connected together.

The display device 1 is a monochrome display device, for example, and one display element 3 configures one pixel. In accordance with the scanning signal from the scanning unit 102, line-sequential scanning is performed on the display device 1 for each row. The display element 3 located in the m-th row and the n-th column is hereinafter referred to as the (n, m)-th display element 3 or the (n, m)-th pixel. In addition, a scanning period (horizontal scanning period) assigned to the display element 3 in the m-th row is represented by a reference sign $H_m$.

In the display device 1, the display elements 3 configuring N pixels arranged in the m-th row are simultaneously driven. In other words, in N display elements 3 arranged along the row direction, timing of light emission/non-light emission is controlled for each row to which the N display elements 3 belong. If a display frame rate of the display device 1 is represented as FR (times/second), the scanning period per row (so-called horizontal scanning period) when the line sequential scanning is performed on the display device 1 for each row is less than $(1/FR) \times (1/M)$ seconds.

A video signal $D_{Sig}$ representing a gradation according to an image to be displayed is input to the display device 1 from a device not illustrated, for example. The video signal $D_{Sig}$ is a digital signal having a gradation bit length such as 8 bits, 16 bits, and 24 bits. A video signal corresponding to the (n, m)-th display element 3 among the video signal $D_{Sig}$ input may be represented as $D_{Sig(n, m)}$.

The data driver 103 generates the voltage of the ramp waveform whose magnitude of slope corresponds to a value of the video signal $D_{Sig}$, and supplies the voltage to the data line DTL. The voltage of the ramp waveform whose magnitude of slope corresponds to the value of the video signal $D_{Sig}$ is supplied to the data line DTL for each horizontal scanning period. The voltage of the ramp waveform corresponding to the video signal $D_{Sig}$ is represented as $V_{Sig}$. In addition, in a case of indicating that the voltage of the ramp waveform $V_{Sig}$ corresponds to the (n, m)-th display element 3, for example, the voltage of the ramp waveform may be represented as $V_{Sig(n, m)}$.

The power supply unit 101 supplies the drive voltage $V_{DS-H}$ and the initialization voltage $V_{DS-L}$ to the feeder line DS.

The light-emitting unit ELP includes the organic electroluminescence light-emitting unit. The light-emitting unit ELP has known configuration and structure including an anode electrode, a hole transporting layer, a light emitting layer, an electron transporting layer, a cathode electrode, and the like.

A voltage $V_{Cath}$ (for example, 0 [volts]) is applied to the other end (specifically, the cathode electrode) of the light-emitting unit ELP. In addition, a threshold voltage required for light emission of the light-emitting unit ELP is represented as $V_{th\text{-}EL}$. If a voltage equal to or higher than $V_{th\text{-}EL}$ is applied between the anode electrode and the cathode electrode of the light-emitting unit ELP, the light-emitting unit ELP emits light.

A reference sign $C_{EL}$ represents capacitance of the light-emitting unit ELP. Note that, in a case where the capacitance of the light-emitting unit ELP is small so that a trouble occurs in driving the display element 3, for example, auxiliary capacitance $C_{Sub}$ connected in parallel to the light-emitting unit ELP may be provided. Hereinafter, description will be made assuming that the auxiliary capacitance $C_{Sub}$ is provided; however, this is merely an example. The auxiliary capacitance $C_{Sub}$ may be omitted.

Figure 2:
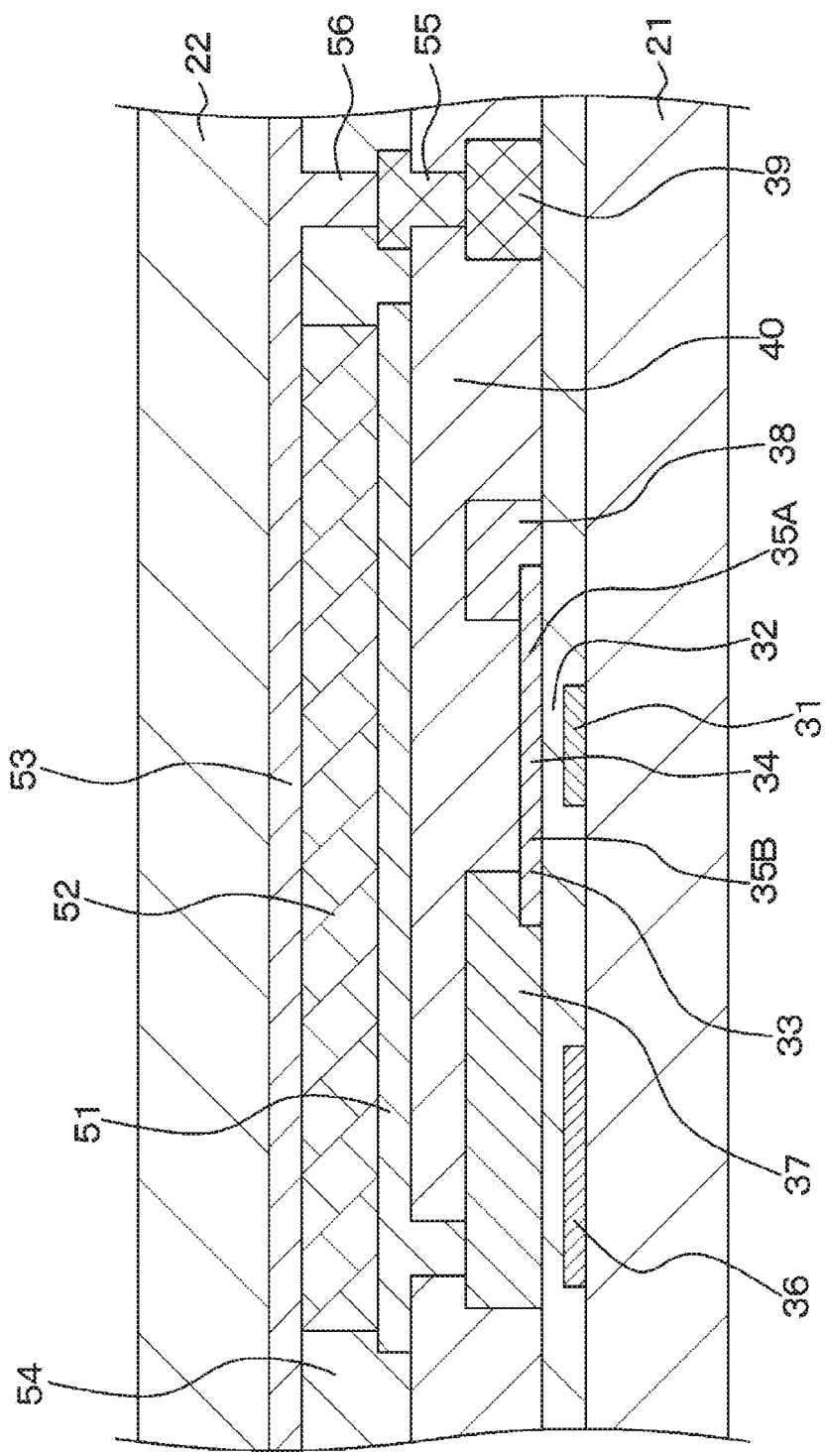
FIG. 2 is a schematic partial cross-sectional view of a portion including a display element in a display unit.

Here, arrangement relationships will be described among the light-emitting unit ELP, the transistor, and the like. FIG. 2 is a schematic partial cross-sectional view of a portion including the display element in the display unit.

The drive transistor $TR_{Drv}$, the first switching element $TR_{WS1}$, the second switching element $TR_{WS2}$, the capacitor $C_{HD}$, and the coupling capacitance $C_{CP}$ are formed on a support 21. Then, the light-emitting unit ELP is formed above these via an interlayer insulating layer 40. In addition, the other source/drain region of the drive transistor $TR_{Drv}$ is connected to the anode electrode included in the light-emitting unit ELP via a contact hole. Note that, in FIG. 2, only the drive transistor $TR_{Drv}$ and the capacitor $C_{HD}$ are illustrated. The first switching element $TR_{WS1}$, the second switching element $TR_{WS2}$, and the coupling capacitance $C_{CP}$ are hidden and invisible.

The drive transistor $TR_{Drv}$, includes a gate electrode 31, a gate insulating layer 32, one source/drain region 35A provided in a semiconductor layer 33, another source/drain region 35B, and a channel formation region 34 corresponding to a portion of the semiconductor layer 33 between the one source/drain region 35A and the other source/drain region 35B. Meanwhile, the capacitor $C_{HD}$ includes one electrode 36, a dielectric layer configured by an extending portion of the gate insulating layer 32, and another electrode 37. The gate electrode 31, a portion of the gate insulating layer 32, and the one electrode 36 configuring the capacitor $C_{HD}$ are formed on the support 21. The one source/drain region 35A of the drive transistor $TR_{Drv}$, is connected to a wiring line 38 (corresponding to the feeder line DS), and the other source/drain region 35B is connected to the other electrode 37. The drive transistor $TR_{Drv}$, the capacitor $C_{HD}$, and the like are covered with the interlayer insulating layer 40, and the light-emitting unit ELP is provided including an anode electrode 51, a hole transporting layer, a light emitting layer, an electron transporting layer, and a cathode electrode 53, on the interlayer insulating layer 40. Note that, in the figure, the hole transporting layer, the light emitting layer, and the electron transporting layer are represented by a single layer 52. A second interlayer insulating layer 54 is provided on a portion of the interlayer insulating layer 40 where the light-emitting unit ELP is not provided, and a transparent substrate 22 is disposed on the second interlayer insulating layer 54 and the cathode electrode 53. Light emitted from the light emitting layer passes through the substrate 22 and is emitted to the outside. Note that, the other electrode 37 and the anode electrode 51 are connected together by the contact hole provided in the interlayer insulating layer 40. In addition, the cathode electrode 53 is connected to a wiring line 39 (corresponding to a common feeder line to which the voltage $V_{Cath}$ is supplied) provided on the extending portion of the gate insulating layer 32 via contact holes 56 and 55 provided in the second interlayer insulating layer 54 and the interlayer insulating layer 40.

Note that, areas of the electrodes configuring the light-emitting unit ELP are larger than areas of the electrodes configuring the capacitor $C_{HD}$. Generally, a capacitance value is in a relationship of the capacitance $C_{EL}$ of the light-emitting unit ELP>capacitance of the capacitor $C_{HD}$.

In the light emitting state of the display element 3, the drive transistor $TR_{Drv}$ illustrated in FIG. 1 is subjected to a voltage setting to operate in a saturation region, and is driven to cause a drain current $I_{ds}$ to flow in accordance with an expression (1) below. As described above, in the light emitting state of the display element 3, the one source/drain region of the drive transistor $TR_{Drv}$, serves as the drain region and the other source/drain region serves as the source region. For convenience of description, the one source/drain region of the drive transistor $TR_{Drv}$, may be simply referred to as the drain region and the other source/drain region may be simply referred to as the source region. Note that, μ: Effective mobility
L: Channel length
W: Channel width
$V_{gs}$: Voltage of gate electrode with respect to source region (gate-source voltage)
$V_{th}$: Threshold voltage
$C_{ox}$: (Relative dielectric constant of gate insulating layer)×(dielectric constant of vacuum)/(thickness of gate insulating layer)

$$k=(1/2)\cdot(W/L)\cdot C_{ox}.$$

$$I_{ds}=k\cdot\mu\cdot(V_{gs}-V_{th})^2 \quad (1)$$

The drain current $I_{ds}$ flows through the light-emitting unit ELP, whereby the light-emitting unit ELP of the display element 3 emits light. Further, intensity of light is controlled in the light-emitting unit ELP when the drain current $I_{ds}$ is flowing, by magnitude of a value of the drain current $I_{ds}$.

An outline of the display device 1 has been described above. Subsequently, an outline will be described of operation of the display device 1, with reference to the drawings.

Figure 3:
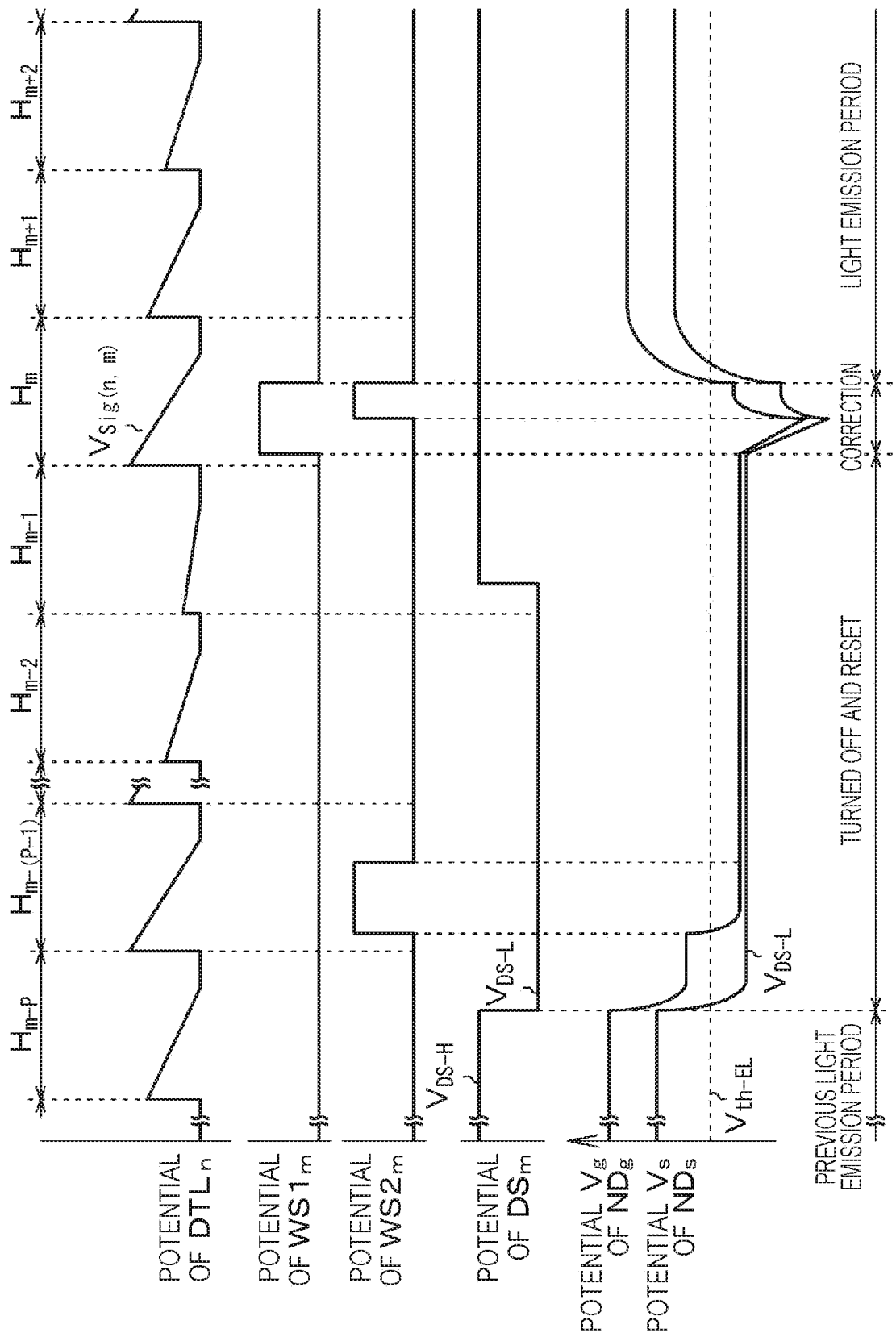
FIG. 3 is a schematic timing chart for explaining operation of the display device according to the first embodiment, more specifically, operation of an (n, m)-th display element of the display device.
Figure 4:
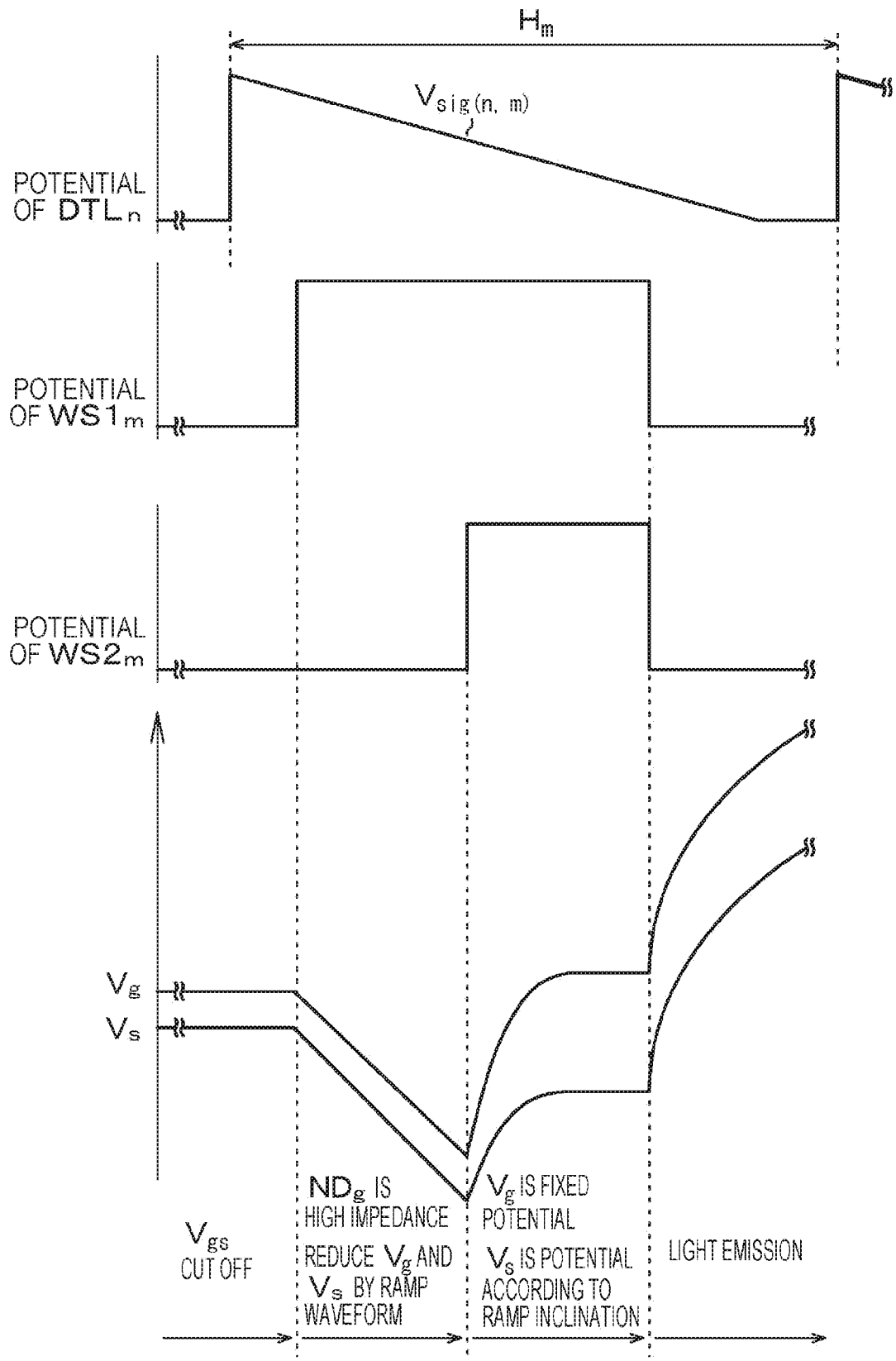
FIG. 4 is a schematic timing chart for explaining operation in a [period-$H_m$] illustrated in FIG. 3.

FIG. 3 is a schematic timing chart for explaining operation of the display device according to the first embodiment, more specifically, operation of the (n, m)-th display element of the display device. FIG. 4 is a schematic timing chart for explaining operation in a [period-$H_m$] illustrated in FIG. 3. FIGS. 5 to 9 are diagrams each schematically illustrating a conductive state/non-conductive state and the like of each transistor configuring a drive circuit of a display element according to the display device of the first embodiment.

The outline of the operation of the display device is as follows. On the basis of operation of the drive unit 100, the display element 3 is scanned at a constant cycle. First, after an initialization voltage $V_{DS-L}$ is applied to the one source/drain region of the drive transistor $TR_{Drv}$, and a potential of the other source/drain region is initialized, the predetermined constant voltage $V_{Ini}$ is applied to the gate electrode of the drive transistor $TR_{Drv}$, and then application of the voltage is shut off, and accordingly a state is set where the voltage of the capacitor $C_{HD}$ is set such that the drive transistor $TR_{Drv}$, is in the non-conductive state and the gate electrode is electrically floating (a [period-$H_{m-p}$] to a [period-$H_{m-1}$] of FIG. 3). Subsequently, the voltage of the ramp waveform is applied to the other source/drain region, and afterwards, the predetermined constant voltage $V_{Ini}$ is applied to the gate electrode in the state where application of the voltage of the ramp waveform is continued, and accordingly the voltage corresponding to the degree of slope of the ramp waveform is held by the capacitor $C_{HD}$ (the first half of the [period-$H_m$] of FIG. 3). Then, after the voltage corresponding to the degree of slope of the ramp waveform is held by the capacitor $C_{HD}$, application of the predetermined constant voltage $V_{Ini}$ to the gate electrode of the drive transistor $TR_{Drv}$ is shut off, and accordingly the light-emitting unit ELP is caused to emit light by the current flowing via the drive transistor $TR_{Drv}$ (after the latter half of the [period $H_m$] of FIG. 3). Note that, a period during which the voltage of the ramp waveform is applied to the other source/drain region of the drive transistor $TR_{Drv}$ is set to a constant length within the cycle. Then, a period during which the predetermined constant voltage $V_{Ini}$ is applied to the gate electrode in the state where application of the voltage of the ramp waveform is continued is set to a constant length within the cycle.

In the following description, the values of the voltage or the potential are set as follows, but these are values for the purpose of illustration only and are not limited to these values.

$V_{Ini}$: Predetermined constant voltage applied to one source/drain region of second switching element $TR_{WS2}$
  . . . 0 volts
$V_{DS-L}$: Initialization voltage for initializing potential of another source/drain region of drive transistor $TR_{Drv}$,
  . . . −1 volt
$V_{DS-H}$: Drive voltage
  . . . 20 volts
$V_{th}$: Threshold voltage of drive transistor $TR_{Drv}$,
  . . . 3 volts
$V_{Cath}$: Voltage applied to cathode electrode of light-emitting unit ELP
  . . . 0 volts
$V_{th-EL}$: Threshold voltage of light-emitting unit ELP
  . . . 4 volts Note that, the ramp waveform supplied to the data line DTL is set such that the slope changes corresponding to the value of the video signal $D_{sig}$ with reference to 0 volts, and a peak value is 20 volts when the video signal $D_{Sig}$ is the maximum.

Figure 5A:
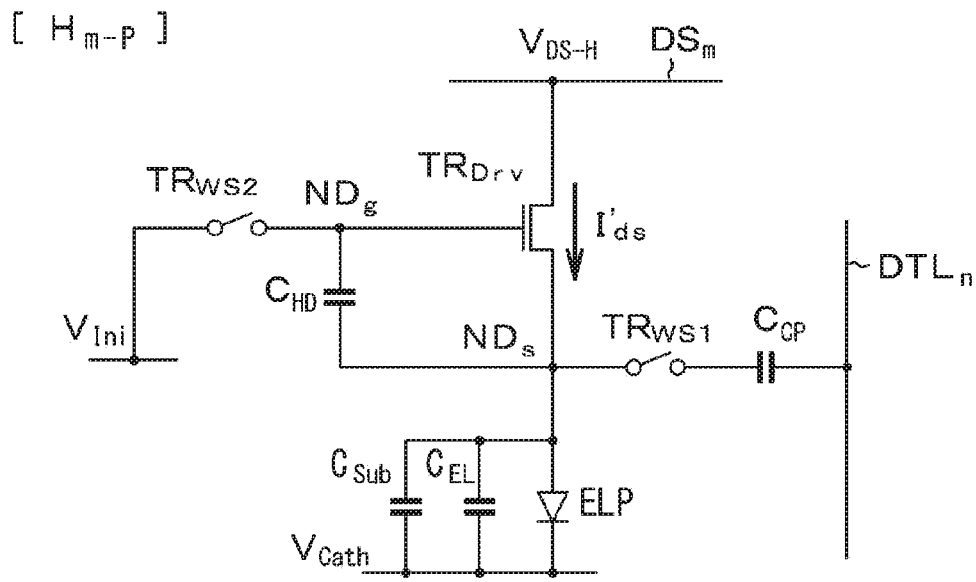
FIGS. 5A and 5B are diagrams each schematically illustrating a conductive state/non-conductive state and the like of each transistor configuring a drive circuit of a display element according to the display device of the first embodiment.
Figure 5B:
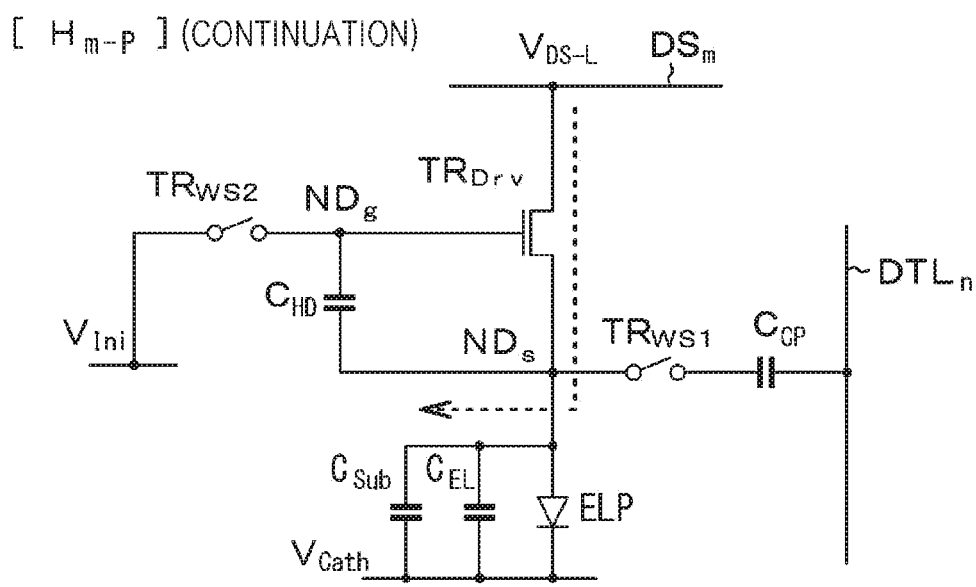

[Period-$H_{m-P}$] (see FIGS. 3, 5A, and 5B)

This [period-$H_{m-P}$] is, for example, of operation in a previous display frame, and is a period during which continuing light emission of the (n, m)-th display element 3 is turned off after completion of the previous various types of processing. Note that, a value of a reference sign "P" may be set as appropriate on the basis of a specification of the display device or the like.

The drive voltage $V_{DS-H}$ is supplied to the feeder line $DS_m$ until the middle of this period, and a drain current $I_{ds}'$ based on the expression (1) described above flows through the light-emitting unit ELP in the display element 3 configuring the (n, m)-th pixel, and a luminance of the display element 3 configuring the (n, m)-th pixel is a value corresponding to the drain current $I_{ds}'$. The drive transistor $TR_{Drv}$ is in a conductive state, and the first switching element $TR_{WS1}$ and the second switching element $TR_{WS2}$ are each in a non-conductive state (see FIG. 5A).

Subsequently, the initialization voltage $V_{DS-L}$ is applied to the one source/drain region of the drive transistor $TR_{Drv}$, and the potential of the other source/drain region is initialized.

Specifically, in the middle of the [period-$H_{m-P}$], the voltage supplied to the feeder line $DS_m$ is switched from the drive voltage $V_{DS-H}$ to the initialization voltage $V_{DS-L}$. Since the drive transistor $TR_{Drv}$ is in the conductive state, the potential of the other source/drain region of the drive transistor $TR_{Drv}$ (in other words, the potential of the node $N_{DS-L}$, represented by a reference sign $V_s$) is initialized to $V_{DS-L}$. Since the initialization voltage $V_{DS-L}$ is set not to exceed ($V_{th-EL}+V_{cath}$), the voltage across the light-emitting unit ELP is less than $V_{th-EL}$. Therefore, no current flows in the light-emitting unit ELP, so that the light-emitting unit ELP is turned off (see FIG. 5B).

Figure 6A:
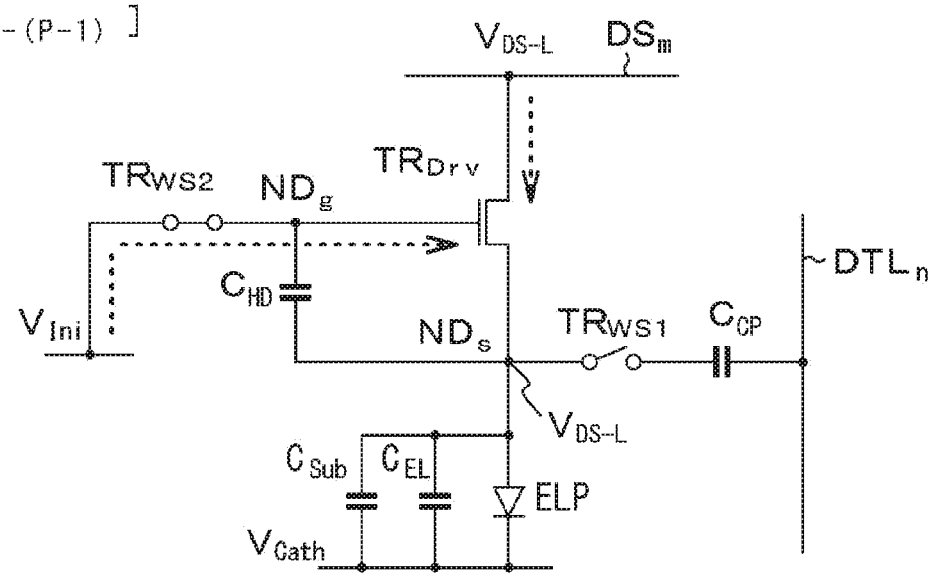
FIGS. 6A and 6B are diagrams each schematically illustrating the conductive state/non-conductive state and the like of each transistor configuring the drive circuit of the display element according to the display device of the first embodiment, continuing from FIG. 5B.
Figure 6B:
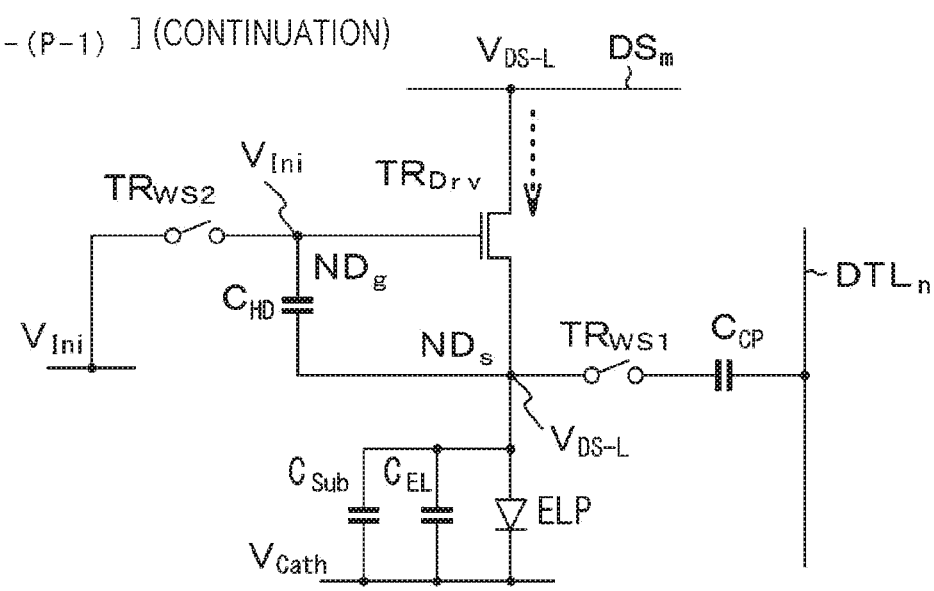

[Period-$H_{m-(P-1)}$] (see FIGS. 3, 6A, and 6B)

In this [period-$H_{m-(P-1)}$], the predetermined constant voltage $V_{Ini}$ is applied to the gate electrode of the drive transistor $TR_{Drv}$ and then application of the voltage is shut off, and accordingly a state is set where the voltage of the capacitor $C_{HD}$ is set such that the drive transistor $TR_{Drv}$ is in the non-conductive state and the gate electrode is electrically floating.

That is, the second scanning line $WS2_m$ is set to a high level, and the second switching element $TR_{WS2}$ is set in the conductive state. As a result, the constant voltage $V_{Ini}$ is applied to the gate electrode of the drive transistor $TR_{Drv}$. A potential of the gate electrode of the drive transistor $TR_{Drv}$ (in other words, a potential of the node $ND_g$, represented by a reference sign $V_g$) is $V_{Ini}$.

Note that, the potential of the node $ND_s$ also changes due to a potential change in the node $ND_g$. However, if the capacitance value including the parasitic capacitance $C_{EL}$ of the light-emitting unit ELP and the auxiliary capacitance $C_{sub}$ is a large value with respect to a value of the capacitor $C_{HD}$, the change in the potential of the node $ND_s$ is small. Hereinafter, description will be made without considering the change in the potential of the node $ND_s$ caused by the potential change in the node $ND_g$.

The voltage of the capacitor $C_{HD}$ (in other words, the gate-source voltage $V_{gs}$ of the drive transistor $TR_{Drv}$) is set to ($V_{Ini}-V_{DS-L}$). The constant voltage $V_{Ini}$ is set such that ($V_{Ini}-V_{DS-L}$) does not exceed the threshold voltage $V_{th}$. Therefore, the drive transistor $TR_{Drv}$ is in the non-conductive state (see FIG. 6A).

Afterwards, the second scanning line $WS2_m$ is set to a low level, and the second switching element $TR_{WS2}$ is set in the non-conductive state. As a result, the application of the constant voltage $V_{Ini}$ to the gate electrode of the drive transistor $TR_{Drv}$ is shut off. The potentials of the nodes $ND_g$ and $ND_s$ do not change (see FIG. 6B). This state is maintained until a [period-$H_{m-2}$].

Figure 7A:
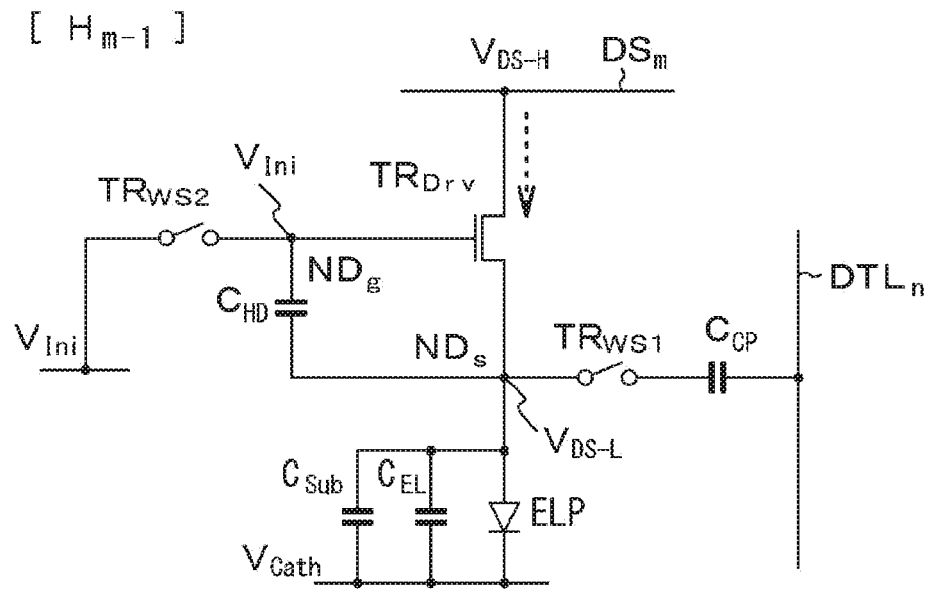
FIGS. 7A and 7B are diagrams each schematically illustrating the conductive state/non-conductive state and the like of each transistor configuring the drive circuit of the display element according to the display device of the first embodiment, continuing from FIG. 6B.
Figure 7B:
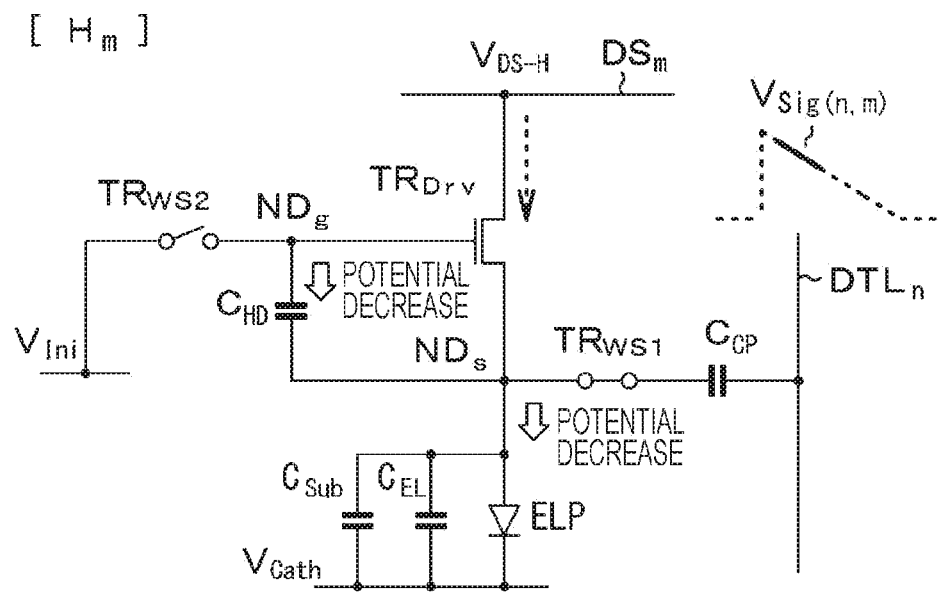
Figure 8A:
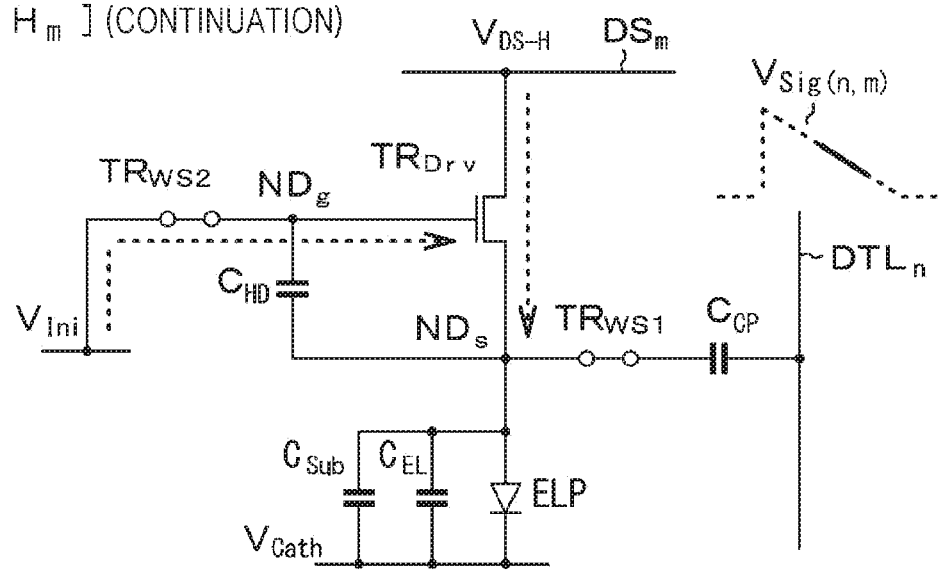
FIGS. 8A and 8B are diagrams each schematically illustrating the conductive state/non-conductive state and the like of each transistor configuring the drive circuit of the display element according to the display device of the first embodiment, continuing from FIG. 7B.
Figure 8B:
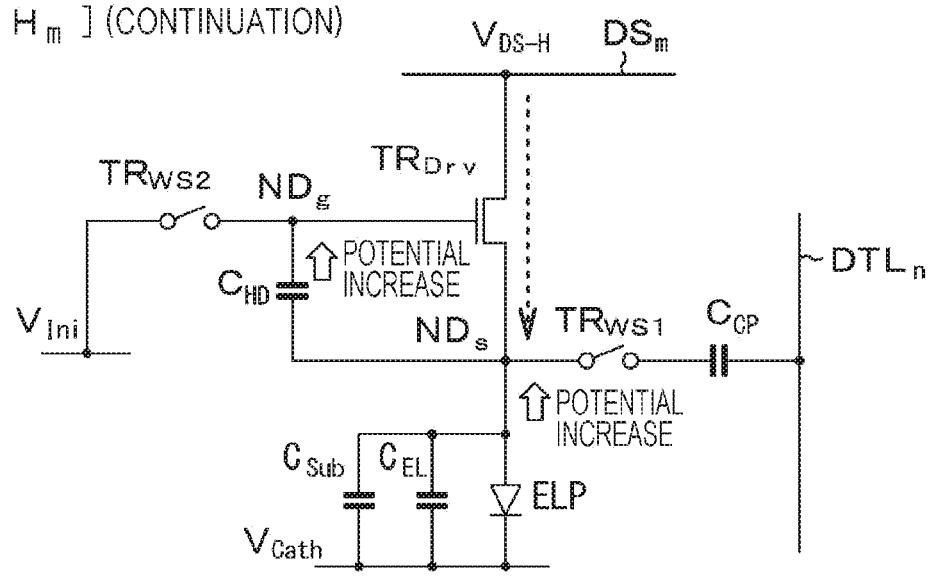

[Period-$H_{m-1}$] (see FIGS. 3 and 7A)

In the middle of this [period-$H_{m-1}$], the voltage supplied to the feeder line $DS_m$ is switched from the initialization voltage $V_{DS-L}$ to the drive voltage $V_{DS-H}$. Since the drive transistor $TR_{Drv}$ is in the non-conductive state, the potential of the node $ND_s$ maintains a previous value. This also applies to the node $ND_g$. The voltage of the capacitor $C_{HD}$ is set such that the drive transistor $TR_{Drv}$ is in the non-conductive state, and the gate electrode is electrically floating.

[Period-$H_m$] (see FIGS. 3, 4, 7B, 8A, 8B, and 9)

In this [period-$H_m$], the voltage of the ramp waveform is applied to the other source/drain region in the state where the voltage of the capacitor $C_{HD}$ is set such that the drive transistor $TR_{Drv}$ is in the non-conductive state and the gate electrode is electrically floating, and afterwards, the predetermined constant voltage $V_{Ini}$ is applied to the gate electrode in the state where application of the voltage of the ramp waveform is continued, and accordingly the voltage corresponding to the degree of slope of the ramp waveform is held by the capacitor $C_{HD}$.

A period during which the voltage of the ramp waveform is applied to the other source/drain region of the drive transistor $TR_{Drv}$ (in other words, the period during which the first scanning line $WS1_m$ is set to a high level in FIG. 4) is set to a constant length within the cycle. Then, a period during which the predetermined constant voltage $V_{Ini}$ is applied to the gate electrode in the state where application of the voltage of the ramp waveform is continued (in other words, a period during which the second scanning line $WS2_m$ is set to the high level in FIG. 4) is set to a constant length within the cycle. Note that, the lengths of these periods may be appropriately selected and set in accordance with the design of the display element or the like.

Then, after the voltage corresponding to the degree of slope of the ramp waveform is held by the capacitor $C_{HD}$, application of the voltage of the ramp waveform to the other source/drain region of the drive transistor $TR_{Drv}$, and application of the predetermined constant voltage $V_{Ini}$ to the gate electrode of the drive transistor $TR_{Drv}$, are shut off, and accordingly the light-emitting unit ELP is caused to emit light by the current flowing via the drive transistor $TR_{Drv}$.

In the [period-$H_m$], a voltage $V_{Sig(m,n)}$ of the ramp waveform whose magnitude of slope corresponds to a value of an image video signal $D_{Sig(m,n)}$ is supplied to the data line $DTL_n$. Note that, in the first embodiment, the ramp waveform has a falling shape.

The beginning period of the [period-$H_m$] is in a state where the voltage of the capacitor $C_{HD}$ is set such that the drive transistor $TR_{Drv}$, is in the non-conductive state, and the gate electrode is electrically floating. Here, the first scanning line $WS1_m$ is set to the high level, and the first switching element $TR_{WS1}$ is set in the conductive state. The voltage of the ramp waveform falling is applied to the node $ND_s$ via the coupling capacitance $C_{CP}$. As a result, the potential of the node $ND_s$ also falls and decreases. In addition, since the node $ND_g$ and the node $ND_s$ are connected together by the capacitor $C_{HD}$, the potential of the node $ND_g$ also falls and decreases (see FIGS. 4 and 7B).

Afterwards, in a state where the conductive state of the first switching element $TR_{WS1}$ is maintained and application of the voltage of the ramp waveform to the node $ND_s$ is continued, the second scanning line $WS2_m$ is set to the high level and the second switching element $TR_{WS2}$ is set in the conducting state. As a result, the constant voltage $V_{Ini}$ is applied to the gate electrode of the drive transistor $TR_{Drv}$ (see FIGS. 4 and 8A).

Since the constant voltage $V_{Ini}$ is applied to the gate electrode of the drive transistor $TR_{Drv}$ in a state where the potential of the node $ND_s$ falls and decreases, the gate-source voltage $V_{gs}$ of the drive transistor $TR_{Drv}$ increases and exceeds the threshold voltage $V_{th}$. As a result, the drive transistor $TR_{Drv}$ is in the conductive state, and the current via the drive transistor $TR_{Drv}$ flows into the parasitic capacitance $C_{EL}$ (further, to the auxiliary capacitance $C_{sub}$) of the light-emitting unit ELP, to increase the potential of the node $ND_s$. Meanwhile, since application of the voltage of the ramp waveform is continued to the node $ND_s$ via the coupling capacitance $C_{CP}$, the potential of the node $ND_s$ is caused to fall.

After all, a value of the gate-source voltage $V_{gs}$ of the drive transistor $TR_{Drv}$ (in other words, the voltage of the capacitor $C_{HD}$) settles such that an increase in the potential of the node $ND_s$ due to a flow of the current via the drive transistor $TR_{Drv}$ and a decrease in the potential of the node $ND_s$ due to continuation of application of the voltage of the ramp waveform via the coupling capacitance $C_{CP}$ are balanced with each other.

For example, if the slope is steeper with respect to a certain ramp waveform, a function of decreasing the potential of the node $ND_s$ is stronger, and the gate-source voltage $V_{gs}$ is larger. Conversely, if the slope is gentler with respect to a certain ramp waveform, the gate-source voltage $V_{gs}$ is smaller. As a result, a voltage corresponding to the slope of the ramp waveform is held by the capacitor $C_{HD}$.

Afterwards, the first scanning line $WS1m$ and the second scanning line $WS2_m$ are each set to the low level, and the first switching element $TR_{WS1}$ and the second switching element $TR_{WS2}$ are each set in the non-conductive state. As a result, after the voltage corresponding to the degree of slope of the ramp waveform is held by the capacitor $C_{HD}$, application of the voltage of the ramp waveform to the other source/drain region of the drive transistor $TR_{Drv}$ and application of the predetermined constant voltage $V_{Ini}$ to the gate electrode of the drive transistor $TR_{Drv}$ are shut off (see FIGS. 4 and 8B).

The potential of the node NDs increases due to the current flowing via the drive transistor TRDrv. Then, the gate electrode of the drive transistor TRDry is in a floating state and moreover the capacitor CHD exists, so that a phenomenon similar to that in a so-called bootstrap circuit occurs in the gate electrode of the drive transistor TRDrv, and the potential of the node NDg also increases.

Figure 9:
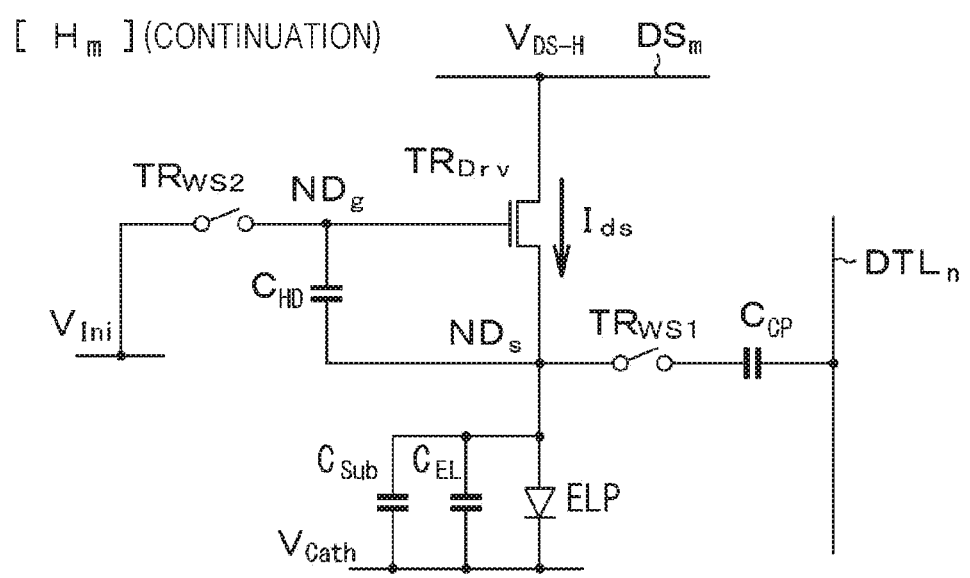
FIG. 9 is a diagram schematically illustrating the conductive state/non-conductive state and the like of each transistor configuring the drive circuit of the display element according to the display device of the first embodiment, continuing from FIG. 8B.

When the potential of the node NDs increases and exceeds (Vth−EL+VCath), the light-emitting unit ELP starts light emission (see FIG. 9). At this time, since a current flowing through the light-emitting unit ELP is the drain current Ids flowing from the drain region to the source region of the drive transistor TRDrv, the current can be expressed by the expression (1).

Then, since the gate-source voltage $V_{gs}$ of the drive transistor $TR_{Drv}$ outputs a current reflecting the degree of the slope of the ramp waveform regardless of the characteristics of the drive transistor $TR_{Drv}$, practically, characteristic variation in the drive transistor $TR_{Drv}$ is not reflected in the current value. Therefore, satisfactory uniformity can be achieved.

The embodiments have been specifically described above; however, the present disclosure is not limited to the embodiments described above, and various modifications can be made based on the technical idea of the present disclosure. For example, numerical values, structures, substrates, raw materials, processes, and the like mentioned in the embodiments described above are merely examples, and numerical values, structures, substrates, raw materials, processes, and the like different from the above may be used as needed.

For example, the drive transistor $TR_{Drv}$, can include a p-channel transistor. In this case, for example, it is sufficient that connection between the anode electrode and the cathode electrode of the light-emitting unit ELP is exchanged, and the voltage value supplied to the feeder line, the ramp waveform supplied to the data line, and the like, are changed as appropriate, correspondingly to a difference in conductivity type.

The display device of the present disclosure described above can be used as a display unit (display device) of an electronic device in all fields, the display unit displaying a video signal input to the electronic device or a video signal generated in the electronic device as an image or a video. For example, the display device can be used as a display unit of a television set, a digital still camera, a laptop personal computer, a mobile terminal device such as a mobile phone, a video camera, a head mounted display, and the like.

The display device of the present disclosure also includes a module shape display device having a sealed configuration. An example is a display module in which a facing unit such as transparent glass is attached to a pixel array unit. Note that the display module may be provided with a circuit unit for inputting/outputting a signal and the like to the pixel array unit from the outside, a flexible printed circuit (FPC), and the like. As a specific example of the electronic device using the display device of the present disclosure, a digital still camera and a head mounted display will be exemplified below. However, the specific example exemplified here is merely an example, and the present invention is not limited to the example.

Specific Example 1

Figure 10A:
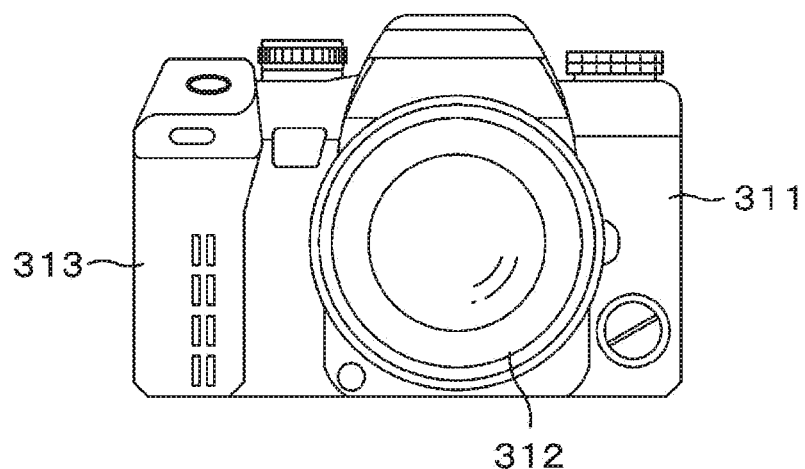
FIG. 10A illustrates a front view of the camera and FIG. 10B illustrates a rear view of the camera.
Figure 10B:
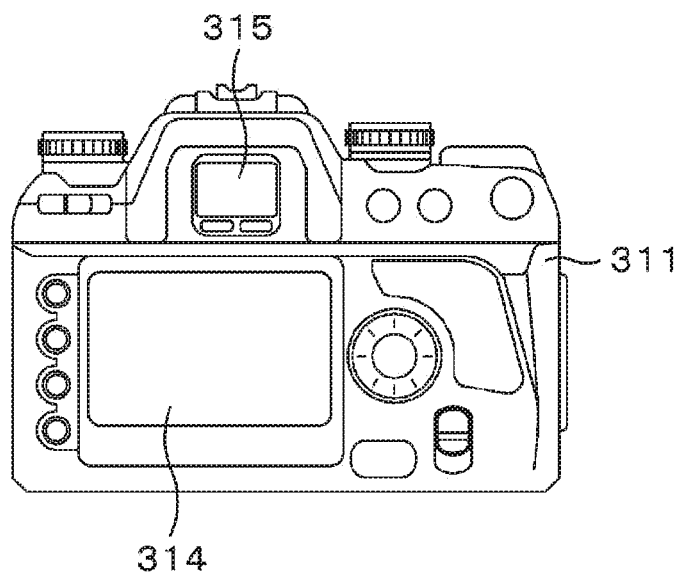

FIG. 10 is an external view of a lens interchangeable single lens reflex type digital still camera, and FIG. 10A illustrates a front view of the camera and FIG. 10B illustrates a rear view of the camera. The lens interchangeable single lens reflex type digital still camera includes an interchangeable photographing lens unit (interchangeable lens) 312 on the front right side of the camera body part (camera body) 311, and includes a grip part 313 to be held by a photographer on the front left side, for example.

Furthermore, a monitor 314 is provided substantially at the center of the rear surface of the camera body part 311. A viewfinder (eyepiece window) 315 is provided on the top of the monitor 314. The photographer can look in the viewfinder 315, to visually recognize an optical image of a subject guided from the photographing lens unit 312 and determine composition.

In the lens interchangeable single lens reflex type digital still camera with the above configuration, the display device of the present disclosure can be used as the viewfinder 315. That is, the lens interchangeable single lens reflex type digital still camera according to this example is manufactured by using the display device of the present disclosure as the viewfinder 315.

Specific Example 2

Figure 11:
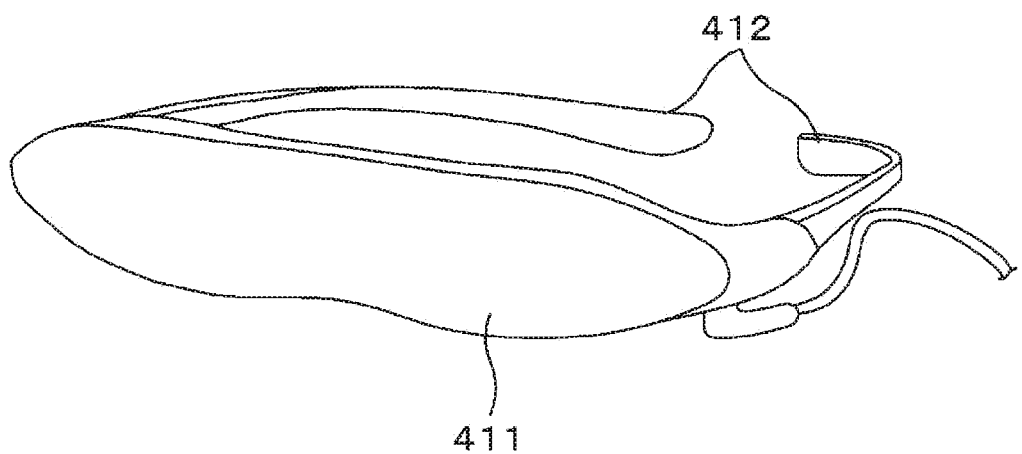
FIG. 11 is an external view of a head mounted display.

FIG. 11 is an external view of a head mounted display. For example, the head mounted display includes an ear hooking part 412 for attaching to the head of a user on both sides of an eyeglasses-shaped display unit 411. In this head mounted display, the display device of the present disclosure can be used as the display unit 411. That is, the head mounted display according to this example is manufactured by using the display device of the present disclosure as the display unit 411.

Specific Example 3

Figure 12:
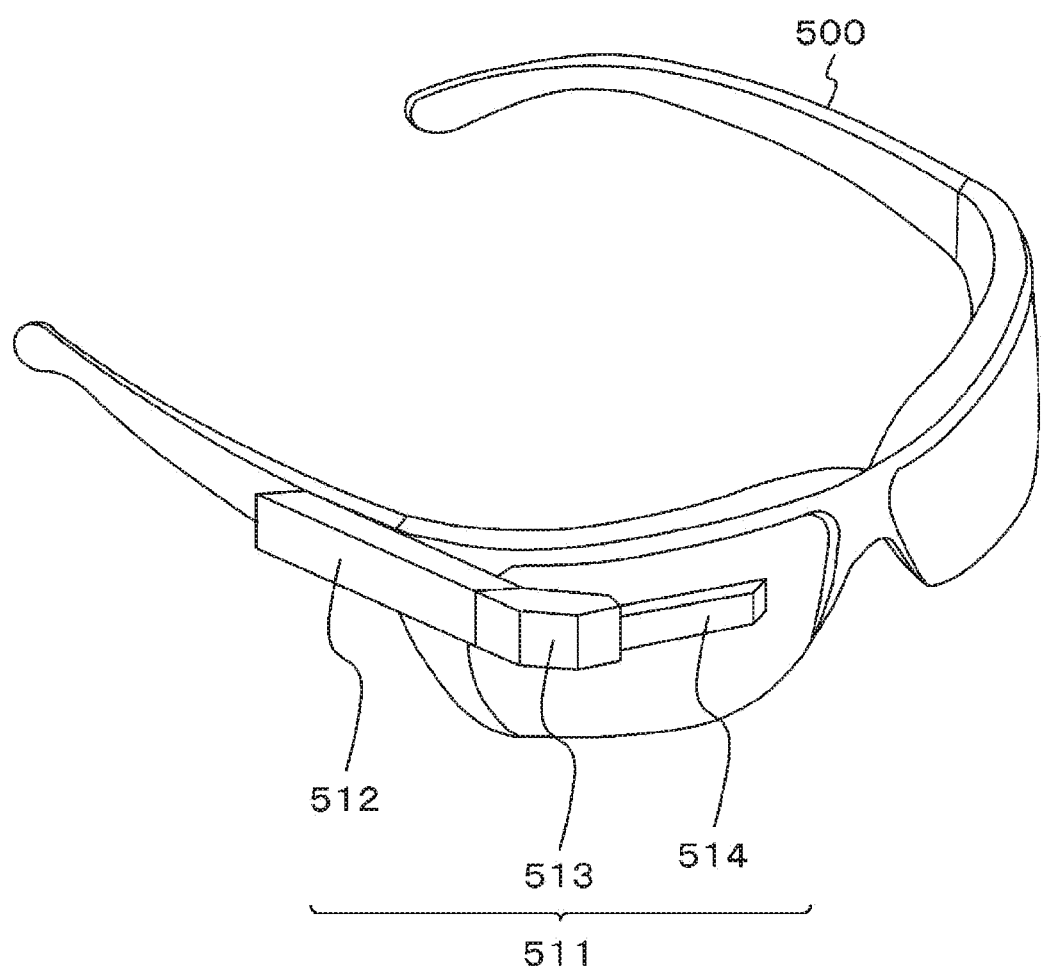
FIG. 12 is an external view of a see-through head mounted display.

FIG. 12 is an external view of a see-through head mounted display. A see-through head mounted display 511 includes a body part 512, an arm 513, and a lens barrel 514.

The body part 512 is connected to the arm 513 and eyeglasses 500. Specifically, an end portion in a long side direction of the body part 512 is coupled to the arm 513, and one side surface of the body part 512 is connected to the eyeglasses 500 via a connection member. Note that, the body part 512 may be directly mounted to the head of a human body.

The body part 512 incorporates a control board for controlling operation of the see-through head mounted display 511 and a display unit. The arm 513 connects the body part 512 and the lens barrel 514 together, and supports the lens barrel 514. Specifically, the arm 513 is coupled to each of the end portion of the body part 512 and an end portion of the lens barrel 514, and fixes the lens barrel 514. In addition, the arm 513 incorporates a signal line for communicating data related to an image provided from the body part 512 to the lens barrel 514.

The lens barrel 514 projects image light provided from the body part 512 via the arm 513 toward eyes of a user wearing the see-through head mounted display 511 through an eyepiece. In the see-through head mounted display 511, the display device of the present disclosure can be used for the display unit of the body part 512.

Note that, the advantageous effects described in this specification are merely examples, and the advantageous effects of the present technology are not limited to them and may include other effects.

Note that, the technology of the present disclosure can also adopt the following configuration.

[1]

A display element including:

a light-emitting unit and a drive circuit that drives the light-emitting unit, in which the drive circuit includes at least a drive transistor and a capacitor, and the drive transistor is configured such that a voltage is supplied to one source/drain region, and another source/drain region is connected to the light-emitting unit, and a current corresponding to a voltage held by the capacitor flows through the light-emitting unit via the drive transistor, and a voltage of a ramp waveform is applied to the other source/drain region in a state where a voltage of the capacitor is set such that the drive transistor is in a non-conductive state and a gate electrode is electrically floating, and afterwards, a predetermined constant voltage is applied to the gate electrode in a state where application of the voltage of the ramp waveform is continued, and accordingly a voltage corresponding to a degree of slope of the ramp waveform is held by the capacitor.

[2]

The display element according to [1], in which the display element is scanned at a constant cycle, and a period during which the voltage of the ramp waveform is applied to the other source/drain region of the drive transistor is set to a constant length within the cycle.

[3]

The display element according to [1] or [2], in which a period during which the predetermined constant voltage is applied to the gate electrode in a state where application of the voltage of the ramp waveform is continued is set to a constant length within the cycle.

[4]

The display element according to any of [1] to [3], in which the drive transistor includes an n-channel field effect transistor, and the capacitor is connected between the gate electrode of the drive transistor and the other source/drain region.

[5]

The display element according to any of [1] to [4], in which the drive circuit further includes a first switching element, in the first switching element, the voltage of the ramp waveform is supplied to one end, and another end is connected to the other source/drain region of the drive transistor, and the first switching element is set in a conductive state, and accordingly the voltage of the ramp waveform is applied to the other source/drain region of the drive transistor.

[6]
The display element according to [5], in which
the voltage of the ramp waveform is supplied to the one end of the first switching element via a coupling capacitance.

[7]
The display element according to [5], in which
the other end of the first switching element is connected to the other source/drain region of the drive transistor via a coupling capacitance.

[8]
The display element according any of [1] to [7], in which
the drive circuit further includes a second switching element,
in the second switching element, a predetermined constant voltage is supplied to one end, and another end is connected to the gate electrode of the drive transistor, and
the second switching element is set in a conductive state, and accordingly the predetermined constant voltage is applied to the gate electrode of the drive transistor.

[9]
The display element according to any of [1] to [8], in which
after an initialization voltage is applied to the one source/drain region of the drive transistor and a potential of the other source/drain region is initialized, the predetermined constant voltage is applied to the gate electrode of the drive transistor and then application of the voltage is shut off, and accordingly the state is set where the voltage of the capacitor is set such that the drive transistor is in the non-conductive state and the gate electrode is electrically floating.

[10]
The display element according to any of [1] to [9], in which
after the voltage corresponding to the degree of slope of the ramp waveform is held by the capacitor, application of the voltage of the ramp waveform to the other source/drain region of the drive transistor and application of the predetermined constant voltage to the gate electrode of the drive transistor are shut off, and accordingly the light-emitting unit is caused to emit light by the current flowing via the drive transistor.

[11]
The display element according to any of [1] to [10], in which
the light-emitting unit includes a current drive type electro-optical element whose light emission luminance varies in accordance with a value of a current flowing.

[12]
The display element according to [11], in which
the light-emitting unit includes an organic electroluminescence light-emitting unit.

[13]
A method for driving a display element, the method including:
using a display element including a light-emitting unit and a drive circuit that drives the light-emitting unit, in which the drive circuit includes at least a drive transistor and a capacitor, and the drive transistor is configured such that a voltage is supplied to one source/drain region, and another source/drain region is connected to the light-emitting unit, and a current corresponding to a voltage held by the capacitor flows through the light-emitting unit via the drive transistor, and
setting the voltage of the capacitor such that the drive transistor is in a non-conductive state and bringing a gate electrode into an electrically floating state, and applying a voltage of a ramp waveform to the other source/drain region, and then applying a predetermined constant voltage to the gate electrode in a state where application of the voltage of the ramp waveform is continued, to cause the capacitor to hold a voltage corresponding to the degree of slope of the ramp waveform.

[14]
The method for driving a display element according to [13], in which
the display element is scanned at a constant cycle, and
a period during which the voltage of the ramp waveform is applied to the other source/drain region of the drive transistor is set to a constant length within the cycle.

[15]
The method for driving a display element according to [13] or [14], in which
a period during which the predetermined constant voltage is applied to the gate electrode in a state where application of the voltage of the ramp waveform is continued is set to a constant length within the cycle.

[16]
The method for driving a display element according to any of [13] to [15], in which
the drive transistor includes an n-channel field effect transistor, and
the capacitor is connected between the gate electrode of the drive transistor and the other source/drain region.

[17]
The method for driving a display element according to any of [13] to [16], in which
the drive circuit further includes a first switching element,
in the first switching element, the voltage of the ramp waveform is supplied to one end, and another end is connected to the other source/drain region of the drive transistor, and
the first switching element is set in a conductive state, and accordingly the voltage of the ramp waveform is applied to the other source/drain region of the drive transistor.

[18]
The method for driving a display element according to [17], in which
the voltage of the ramp waveform is supplied to the one end of the first switching element via a coupling capacitance.

[19]
The method for driving a display element according to [17], in which
the other end of the first switching element is connected to the other source/drain region of the drive transistor via a coupling capacitance.

[20]
The method for driving a display element according any of [13] to [19], in which
the drive circuit further includes a second switching element,
in the second switching element, a predetermined constant voltage is supplied to one end, and another end is connected to the gate electrode of the drive transistor, and
the second switching element is set in a conductive state, and accordingly the predetermined constant voltage is applied to the gate electrode of the drive transistor.

[21]
The method for driving a display element according to any of [13] to [20], in which
after an initialization voltage is applied to the one source/drain region of the drive transistor and a potential of the other source/drain region is initialized, the predetermined constant voltage is applied to the gate electrode of the drive transistor and then application of the voltage is shut off, and accordingly the state is set where the voltage of the capacitor is set such that the drive transistor is in the non-conductive state and the gate electrode is electrically floating.

[22]

The method for driving a display element according to any of [13] to [21], in which
after the voltage corresponding to the degree of slope of the ramp waveform is held by the capacitor, application of the voltage of the ramp waveform to the other source/drain region of the drive transistor and application of the predetermined constant voltage to the gate electrode of the drive transistor are shut off, and accordingly the light-emitting unit is caused to emit light by the current flowing via the drive transistor.

[23]

The method for driving a display element according to any of [13] to [22], in which
the light-emitting unit includes a current drive type electro-optical element whose light emission luminance varies in accordance with a value of a current flowing.

[24]

The method for driving a display element according to [23], in which
the light-emitting unit includes an organic electroluminescence light-emitting unit.

[25]

A display device including:
a display unit on which a display element is arranged; and
a drive unit that drives the display unit, in which
the display element includes a light-emitting unit and a drive circuit that drives the light-emitting unit, the drive circuit includes at least a drive transistor and a capacitor, and the drive transistor is configured such that a voltage is applied to one source/drain region, and another source/drain region is connected to the light-emitting unit, and a current corresponding to a voltage held by the capacitor flows through the light-emitting unit via the drive transistor, and
the drive unit sets the voltage of the capacitor such that the drive transistor is in a non-conductive state and brings a gate electrode into an electrically floating state, and applies a voltage of a ramp waveform to the other source/drain region, and then applies a predetermined constant voltage to the gate electrode in a state where application of the voltage of the ramp waveform is continued, to cause the capacitor to hold a voltage corresponding to the degree of slope of the ramp waveform.

[26]

The display device according to [25], in which
the display element is scanned at a constant cycle, and
a period during which the voltage of the ramp waveform is applied to the other source/drain region of the drive transistor is set to a constant length within the cycle.

[27]

The display device according to [25] or [26], in which
a period during which the predetermined constant voltage is applied to the gate electrode in a state where application of the voltage of the ramp waveform is continued is set to a constant length within the cycle.

[28]

The display device according to any of [25] to [27], in which
the drive transistor includes an n-channel field effect transistor, and
the capacitor is connected between the gate electrode of the drive transistor and the other source/drain region.

[29]

The display device according to any of [25] to [28], in which
the drive circuit further includes a first switching element,
in the first switching element, the voltage of the ramp waveform is supplied to one end, and another end is connected to the other source/drain region of the drive transistor, and
the first switching element is set in a conductive state, and accordingly the voltage of the ramp waveform is applied to the other source/drain region of the drive transistor.

[30]

The display device according to [29], in which
the voltage of the ramp waveform is supplied to the one end of the first switching element via a coupling capacitance.

The display device according to [29], in which
the other end of the first switching element is connected to the other source/drain region of the drive transistor via a coupling capacitance.

[32]

The display device according any of [25] to [31], in which
the drive circuit further includes a second switching element,
in the second switching element, a predetermined constant voltage is supplied to one end, and another end is connected to the gate electrode of the drive transistor, and
the second switching element is set in a conductive state, and accordingly the predetermined constant voltage is applied to the gate electrode of the drive transistor.

[33]

The display device according to any of [25] to [32], in which
after an initialization voltage is applied to the one source/drain region of the drive transistor and a potential of the other source/drain region is initialized, the predetermined constant voltage is applied to the gate electrode of the drive transistor and then application of the voltage is shut off, and accordingly the state is set where the voltage of the capacitor is set such that the drive transistor is in the non-conductive state and the gate electrode is electrically floating.

[34]

The display device according to any of [25] to [33], in which
after the voltage corresponding to the degree of slope of the ramp waveform is held by the capacitor, application of the voltage of the ramp waveform to the other source/drain region of the drive transistor and application of the predetermined constant voltage to the gate electrode of the drive transistor are shut off, and accordingly the light-emitting unit is caused to emit light by the current flowing via the drive transistor.

[35]

The display device according to any of [25] to [34], in which
the light-emitting unit includes a current drive type electro-optical element whose light emission luminance varies in accordance with a value of a current flowing.

[36]

The display device according to [35], in which
the light-emitting unit includes an organic electroluminescence light-emitting unit.

[37]

An electronic device including a display device,
the display device including a display unit on which a display element is arranged; and a drive unit that drives the display unit, in which
the display element includes a light-emitting unit and a drive circuit that drives the light-emitting unit, the drive circuit includes at least a drive transistor and a capacitor, and the drive transistor is configured such that a voltage is supplied to one source/drain region, and another source/drain region is connected to the light-emitting unit, and a current corresponding to a voltage held by the capacitor flows through the light-emitting unit via the drive transistor, and the drive unit sets the voltage of the capacitor such that the drive transistor is in a non-conductive state and brings a gate electrode into an electrically floating state, and applies a voltage of a ramp waveform to the other source/drain region, and then applies a predetermined constant voltage to the gate electrode in a state where application of the voltage of the ramp waveform is continued, to cause the capacitor to hold a voltage corresponding to the degree of slope of the ramp waveform.

[38]
The electronic device according to [37], in which
the display element is scanned at a constant cycle, and
a period during which the voltage of the ramp waveform is applied to the other source/drain region of the drive transistor is set to a constant length within the cycle.

[39]
The electronic device according to [37] or [38], in which
a period during which the predetermined constant voltage is applied to the gate electrode in a state where application of the voltage of the ramp waveform is continued is set to a constant length within the cycle.

[40]
The electronic device according to any of [37] to [39], in which
the drive transistor includes an n-channel field effect transistor, and
the capacitor is connected between the gate electrode of the drive transistor and the other source/drain region.

[41]
The electronic device according to any of [37] to [40], in which
the drive circuit further includes a first switching element,
in the first switching element, the voltage of the ramp waveform is supplied to one end, and another end is connected to the other source/drain region of the drive transistor, and
the first switching element is set in a conductive state, and accordingly the voltage of the ramp waveform is applied to the other source/drain region of the drive transistor.

[42]
The electronic device according to [41], in which
the voltage of the ramp waveform is supplied to the one end of the first switching element via a coupling capacitance.

[43]
The electronic device according to [41], in which
the other end of the first switching element is connected to the other source/drain region of the drive transistor via a coupling capacitance.

[44]
The electronic device according any of [37] to [43], in which
the drive circuit further includes a second switching element,
in the second switching element, a predetermined constant voltage is supplied to one end, and another end is connected to the gate electrode of the drive transistor, and
the second switching element is set in a conductive state, and accordingly the predetermined constant voltage is applied to the gate electrode of the drive transistor.

[45]
The electronic device according to any of [37] to [44], in which
after an initialization voltage is applied to the one source/drain region of the drive transistor and a potential of the other source/drain region is initialized, the predetermined constant voltage is applied to the gate electrode of the drive transistor and then application of the voltage is shut off, and accordingly the state is set where the voltage of the capacitor is set such that the drive transistor is in the non-conductive state and the gate electrode is electrically floating.

[46]
The electronic device according to any of [37] to [45], in which
after the voltage corresponding to the degree of slope of the ramp waveform is held by the capacitor, application of the voltage of the ramp waveform to the other source/drain region of the drive transistor and application of the predetermined constant voltage to the gate electrode of the drive transistor are shut off, and accordingly the light-emitting unit is caused to emit light by the current flowing via the drive transistor.

[47]
The electronic device according to any of [37] to [46], in which
the light-emitting unit includes a current drive type electro-optical element whose light emission luminance varies in accordance with a value of a current flowing.

[48]
The electronic device according to [47], in which
the light-emitting unit includes an organic electroluminescence light-emitting unit.

REFERENCE SIGNS LIST

1 Display device
2 Display unit
3 Display element
4 Drive circuit
21 Support
22 Transparent substrate
31 Gate electrode
32 Gate insulating layer
33 Semiconductor layer
34 Channel formation region
35A One source/drain region
35B Other source/drain region
36 One electrode
37 Other electrode
38, 39 Wiring line
40 Interlayer insulating layer
51 Anode electrode
52 Hole transporting layer, light emitting layer, and electron transporting layer
53 Cathode electrode
54 Second interlayer insulating layer
55, 56 Contact hole
100 Drive unit
101 Power supply unit
102 Scanning unit
102A First scanning unit
102B Second scanning unit
103 Data driver
WS1 First scanning line
WS2 Second scanning line
DTL Data line
DS Feeder line
$TR_{WS1}$ First switching element $TR_{WS2}$ Second switching element
$TR_{Drv}$ Drive transistor
$C_{HD}$ Capacitor
$C_{CP}$ Coupling capacitance
ELP Light-emitting unit
$C_{EL}$ Capacitance of light-emitting unit ELP
$C_{Sub}$ Auxiliary capacitance
$ND_g$ Node configured by gate electrode of drive transistor and the like
$ND_s$ Node configured by source region of drive transistor and the like
311 Camera body part
312 Photographing lens unit
313 Grip part
314 Monitor
315 Viewfinder
500 Eyeglasses
511 See-through head mounted display
512 Body part
513 Arm
514 Lens barrel

The invention claimed is:

1. A display element comprising:
a light-emitting unit; and
a drive circuit that includes:
  a drive transistor, wherein
    a first source/drain region of the drive transistor is configured to receive a supply of a first voltage, and
    a second source/drain region of the drive transistor is connected to the light-emitting unit; and
  a capacitor configured to hold a second voltage, wherein
    a first current corresponding to the second voltage is flowable through the light-emitting unit via the drive transistor,
  the drive circuit is configured to:
    drive the light-emitting unit;
    set a third voltage of the capacitor such that the drive transistor is in a non-conductive state and a gate electrode of the drive transistor is in an electrically floating state;
    control application of a fourth voltage of a ramp waveform to the second source/drain region, based on the third voltage of the capacitor; and
    control application of a specific constant voltage to the gate electrode, based on continuous application of the fourth voltage of the ramp waveform to the second source/drain region, and
    the capacitor is further configured to hold a fifth voltage corresponding to a degree of slope of the ramp waveform based on the application of the specific constant voltage.

2. The display element according to claim 1, wherein
the display element is scanned at a constant cycle, and
a first period during which the fourth voltage of the ramp waveform is applied to the second source/drain region is set to a first constant length within the constant cycle.

3. The display element according to claim 2, wherein
a second period, during which the specific constant voltage is applied to the gate electrode is set to a second constant length, within the constant cycle.

4. The display element according to claim 1, wherein
the drive transistor includes an n-channel field effect transistor, and
the capacitor is connected between the gate electrode and the second source/drain region.

5. The display element according to claim 1, wherein
the drive circuit further includes a first switching element,
a first end of the first switching element is configured to receive a supply of the fourth voltage of the ramp waveform,
a second end of the first switching element is connected to the second source/drain region, and
the fourth voltage of the ramp waveform is applied to the second source/drain region based on a conductive state of the first switching element.

6. The display element according to claim 5, wherein
the first end of the first switching element is further configured to receive the supply of the fourth voltage of the ramp waveform via a coupling capacitance.

7. The display element according to claim 5, wherein
the second end of the first switching element is connected to the second source/drain region via a coupling capacitance.

8. The display element according to claim 1, wherein
the drive circuit further includes a second switching element,
a first end of the second switching element is configured to receive the specific constant voltage,
a second end of the second switching element is connected to the gate electrode, and
the specific constant voltage is applied to the gate electrode based on a conductive state of the second switching element.

9. The display element according to claim 1, wherein
the drive circuit is further configured to set the third voltage of the capacitor based on shut-off of the application of the specific constant voltage to the gate electrode, and
the application of the specific constant voltage to the gate electrode is based on:
  application of an initialization voltage to the first source/drain region, and
  initialization of a potential of the second source/drain region.

10. The display element according to claim 1, wherein
the light-emitting unit is configured to emit light based on:
  a second current that is flowable through the light-emitting unit via the drive transistor,
  a shut-off of the application of the fourth voltage of the ramp waveform to the second source/drain region of the drive transistor, and
  a shut-off of the application of the specific constant voltage to the gate electrode of the drive transistor,
the shut-off of the application of the fourth voltage and the shut-off of the application of the specific constant voltage are based on the fifth voltage held by the capacitor.

11. The display element according to claim 1, wherein
the light-emitting unit includes a current drive type electro-optical element, and
variation of light emission luminance of the electro-optical element is based on a value of a second current that is flowable through the electro-optical element.

12. The display element according to claim 11, wherein
the light-emitting unit further includes an organic electroluminescence light-emitting unit.

* * * * *